(12) United States Patent
Banjouya et al.

(10) Patent No.: US 10,234,709 B2
(45) Date of Patent: Mar. 19, 2019

(54) DISPLAY APPARATUS AND METHOD OF MANUFACTURING THE SAME

(71) Applicant: NLT TECHNOLOGIES, LTD., Kawasaki, Kanagawa (JP)

(72) Inventors: Akira Banjouya, Kawasaki (JP); Akira Suzuki, Kawasaki (JP)

(73) Assignee: NLT Technologies, Ltd., Kawasaki (JP)

( * ) Notice: Subject to any disclaimer, the term of this patent is extended or adjusted under 35 U.S.C. 154(b) by 16 days.

(21) Appl. No.: 15/611,862

(22) Filed: Jun. 2, 2017

(65) Prior Publication Data

US 2017/0351136 A1 Dec. 7, 2017

(30) Foreign Application Priority Data

Jun. 3, 2016 (JP) .................................. 2016-111987

(51) Int. Cl.
| | |
|---|---|
| *G02F 1/1333* | (2006.01) |
| *G02F 1/1343* | (2006.01) |
| *G02F 1/136* | (2006.01) |
| *G02B 1/04* | (2006.01) |
| *H01L 51/52* | (2006.01) |

(Continued)

(52) U.S. Cl.
CPC ......... *G02F 1/133308* (2013.01); *G02B 1/04* (2013.01); *G02F 1/136* (2013.01); *G02F 1/13439* (2013.01); *H01L 51/0024* (2013.01); *H01L 51/5246* (2013.01); *H01L 51/5253* (2013.01); *H01L 51/5275* (2013.01); *H05K 5/02* (2013.01); *G02F 1/13338* (2013.01); *G02F 2001/13332* (2013.01); *G02F 2001/133311* (2013.01); *G02F 2001/133325* (2013.01); *G02F 2001/133331* (2013.01); *G02F 2202/28* (2013.01)

(58) Field of Classification Search
CPC .................................................. G02F 1/133308
See application file for complete search history.

(56) References Cited

U.S. PATENT DOCUMENTS

| | | | |
|---|---|---|---|
| 2009/0183819 A1 | 7/2009 | Matsuhira | |
| 2015/0156897 A1* | 6/2015 | Morimoto | ................ H05K 5/02 361/679.01 |
| 2016/0085111 A1* | 3/2016 | Arita | ................. G02F 1/133308 349/58 |

FOREIGN PATENT DOCUMENTS

| | | |
|---|---|---|
| JP | 2009-175701 A | 8/2009 |
| JP | 2010-66711 A | 3/2010 |
| JP | 2013-88455 A | 5/2013 |

* cited by examiner

*Primary Examiner* — Alexander Gross
(74) *Attorney, Agent, or Firm* — Sughrue Mion, PLLC

(57) ABSTRACT

Provided is a display apparatus or the like based on a housing-in technique capable of improving display quality and yield. A display apparatus comprises an upper-lower substrate 100, a display module 103 including a housing 102 with an opening, a resin member 105 formed on the upper-lower substrate 100 along an entire periphery of an opening of the housing 102, and a front panel 106 opposed to the display module 103 across the resin member 105. The housing 102 is so placed as to be interposed between the upper-lower substrate 100 and the front panel 106. A worked surface 500 is located at a part of a ridge line of a boundary part of the housing 102. The resin member 105 is in contact with the entire periphery of the boundary part of the housing 102 and hangs over the inner edge of the upper surface of the housing 102.

9 Claims, 24 Drawing Sheets

(51) Int. Cl.
*H05K 5/02* (2006.01)
*H01L 51/00* (2006.01)

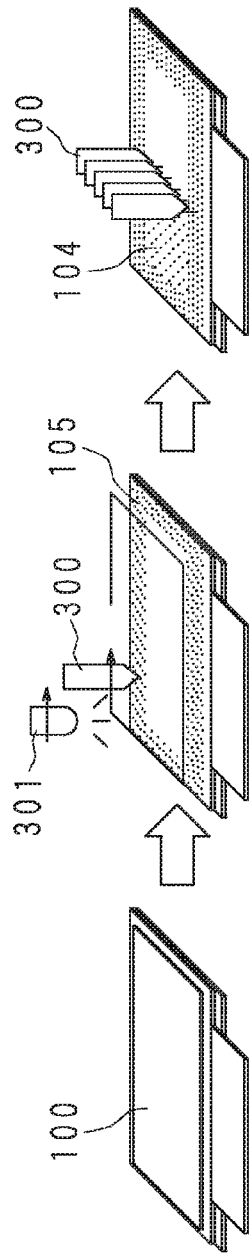
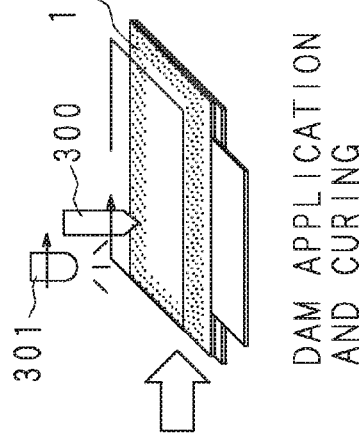
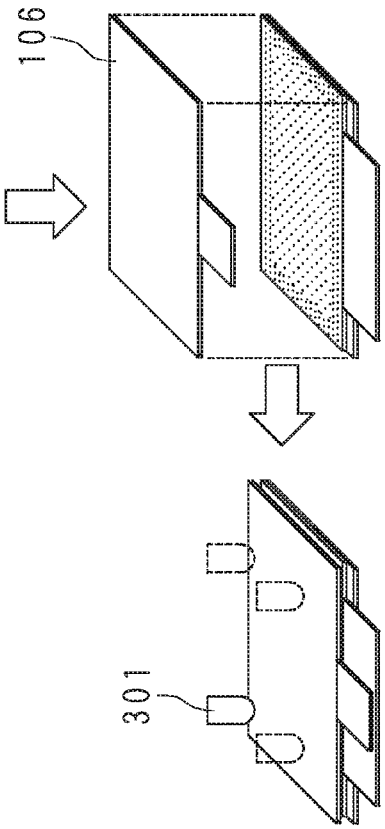
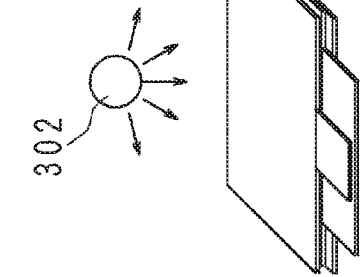
FIG. 2A RELATED ART — WORK PREPARATION
FIG. 2B RELATED ART — DAM APPLICATION AND CURING
FIG. 2C RELATED ART — OCR APPLICATION
FIG. 2D RELATED ART — TEMPORARY BONDING OF THE FRONT PANEL
FIG. 2E RELATED ART — OCR TEMPORARY CURING
FIG. 2F RELATED ART — OCR COMPLETE CURING

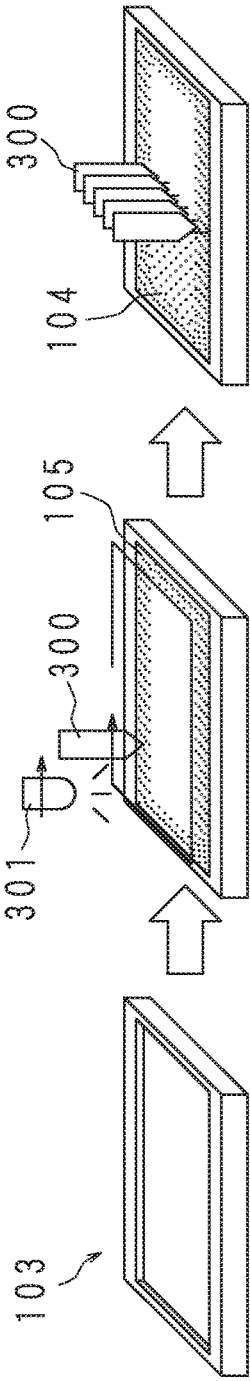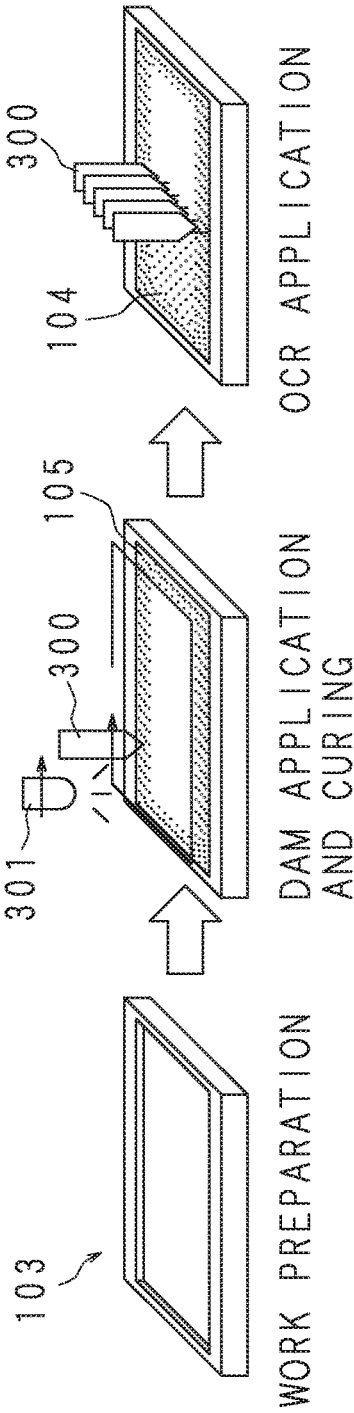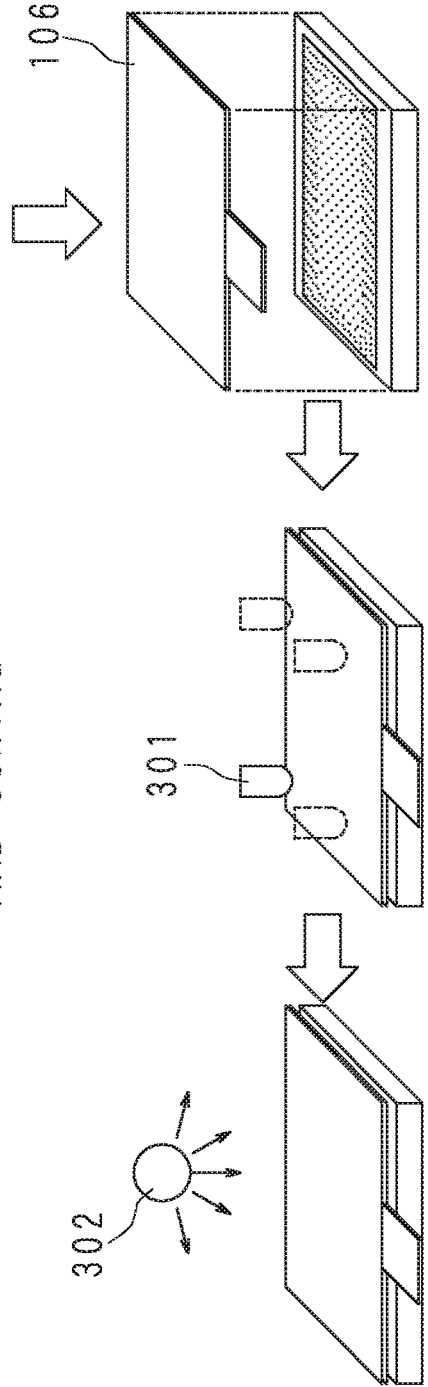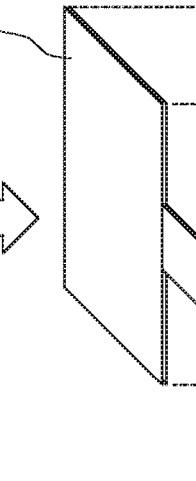
FIG. 3A WORK PREPARATION
FIG. 3B DAM APPLICATION AND CURING
FIG. 3C OCR APPLICATION
FIG. 3D BONDING OF THE FRONT PANEL
FIG. 3E OCR TEMPORARY CURING
FIG. 3F OCR COMPLETE CURING (FINISH)

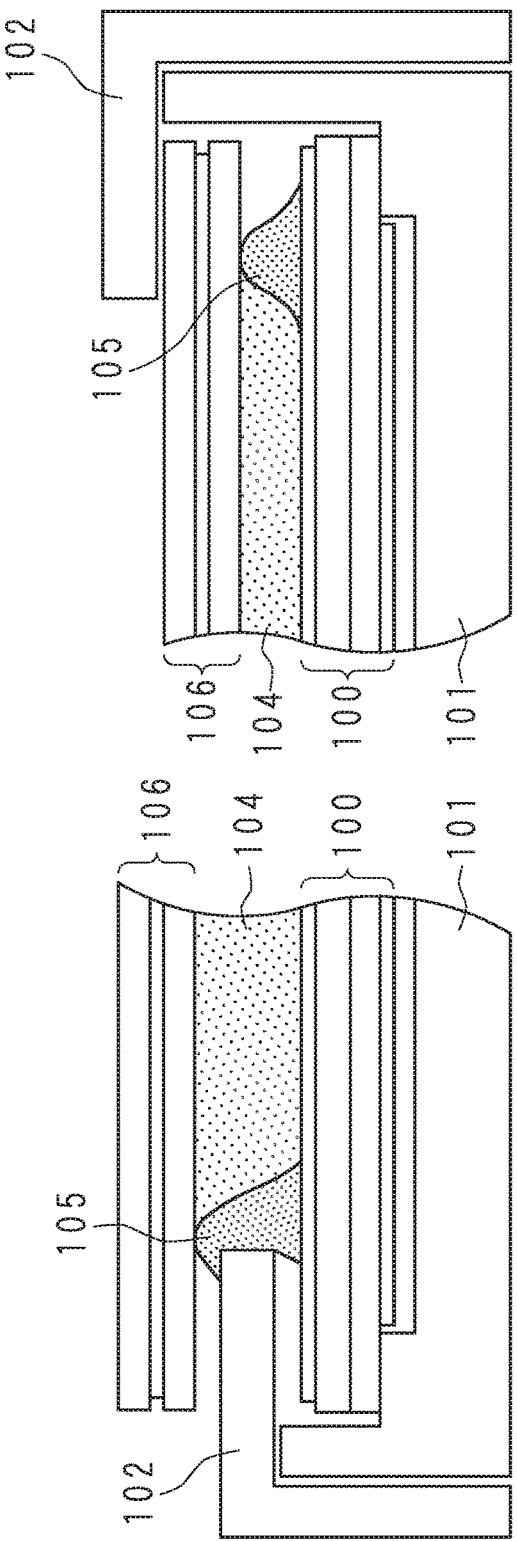

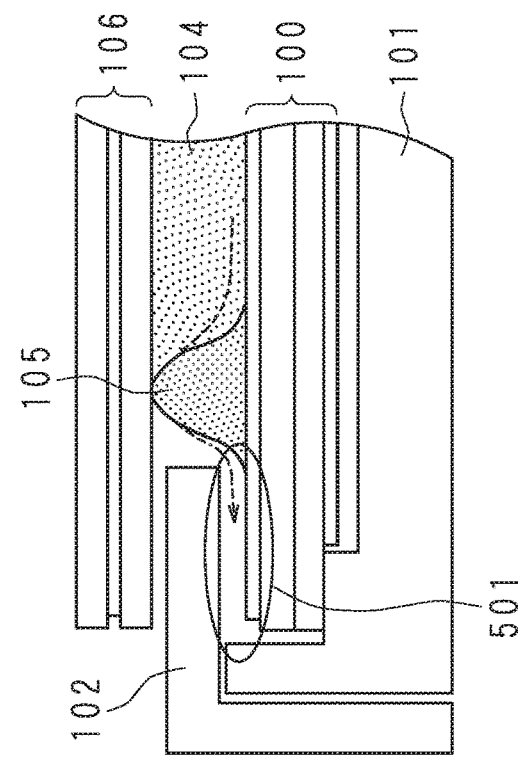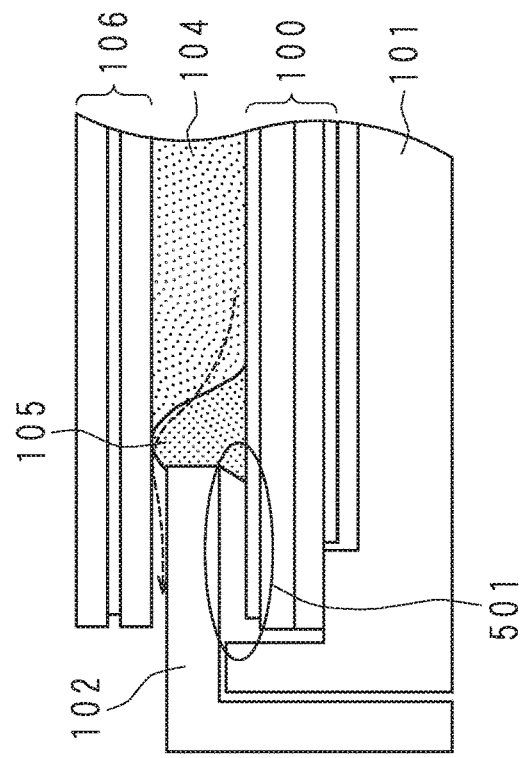

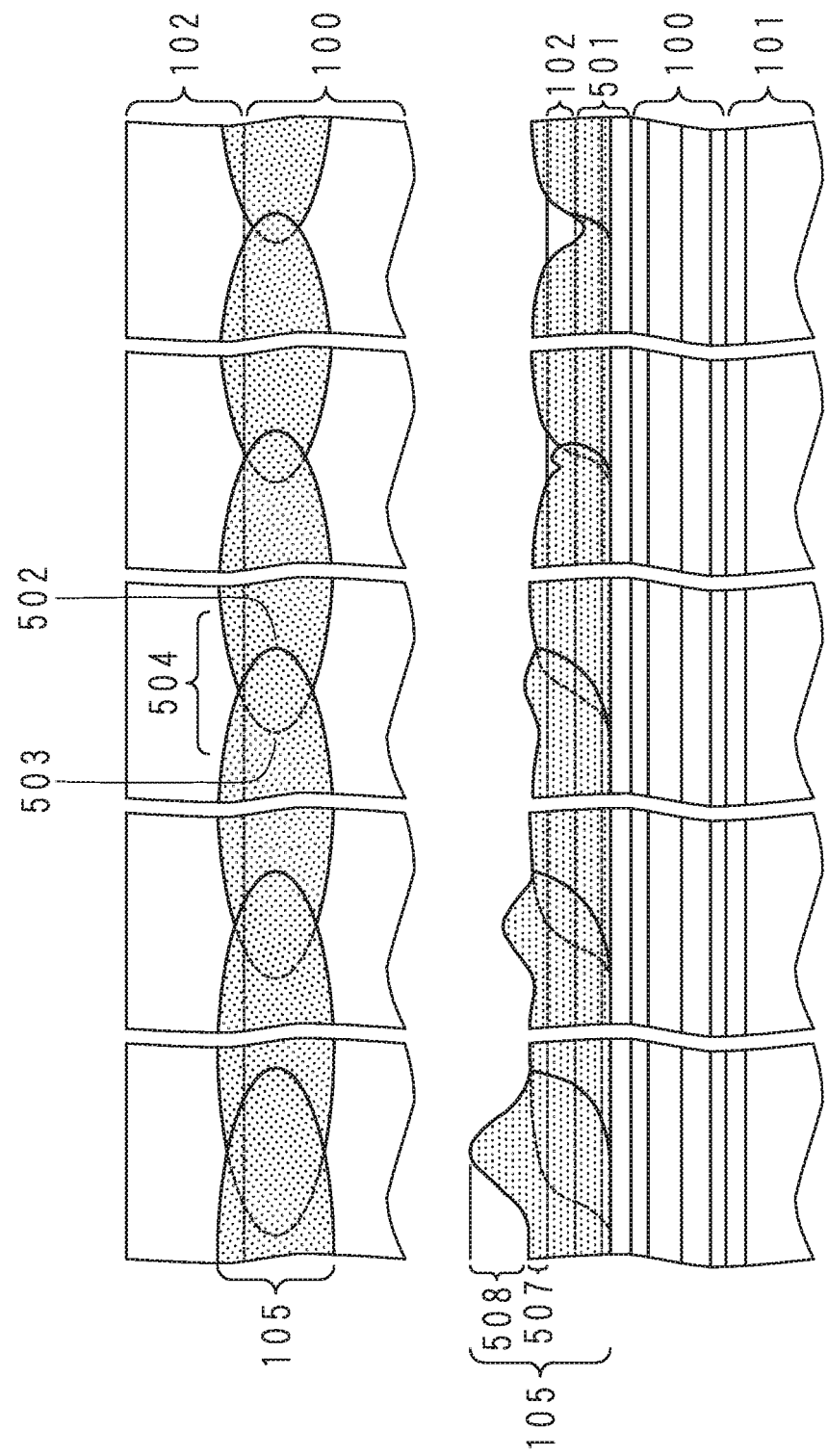

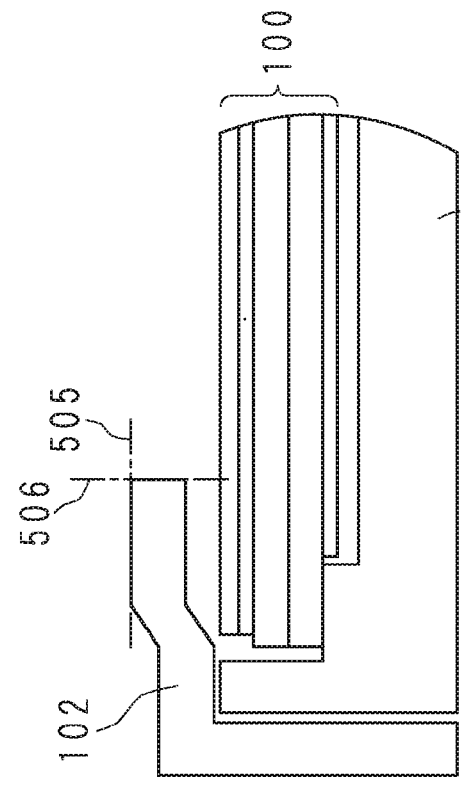
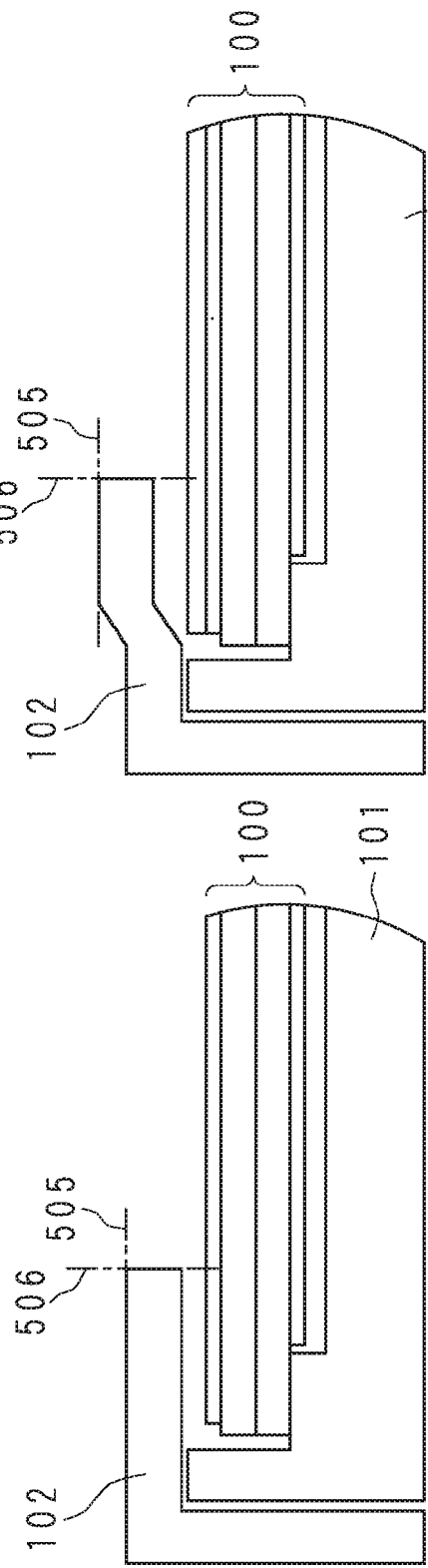
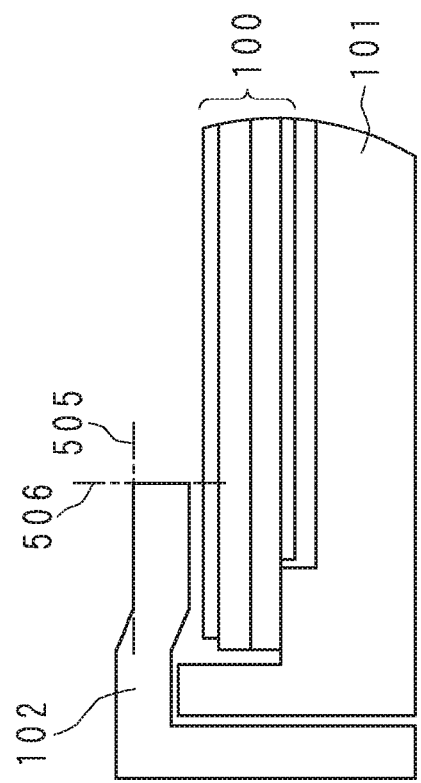

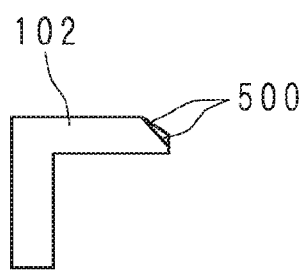 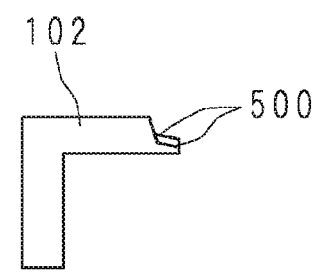
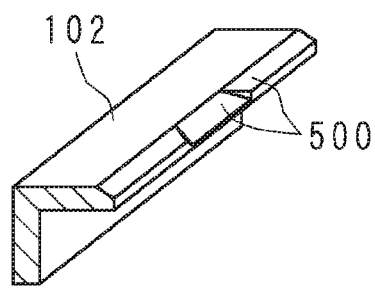 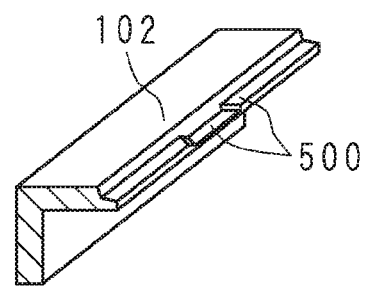
FIG. 16A　　　　　　FIG. 16B

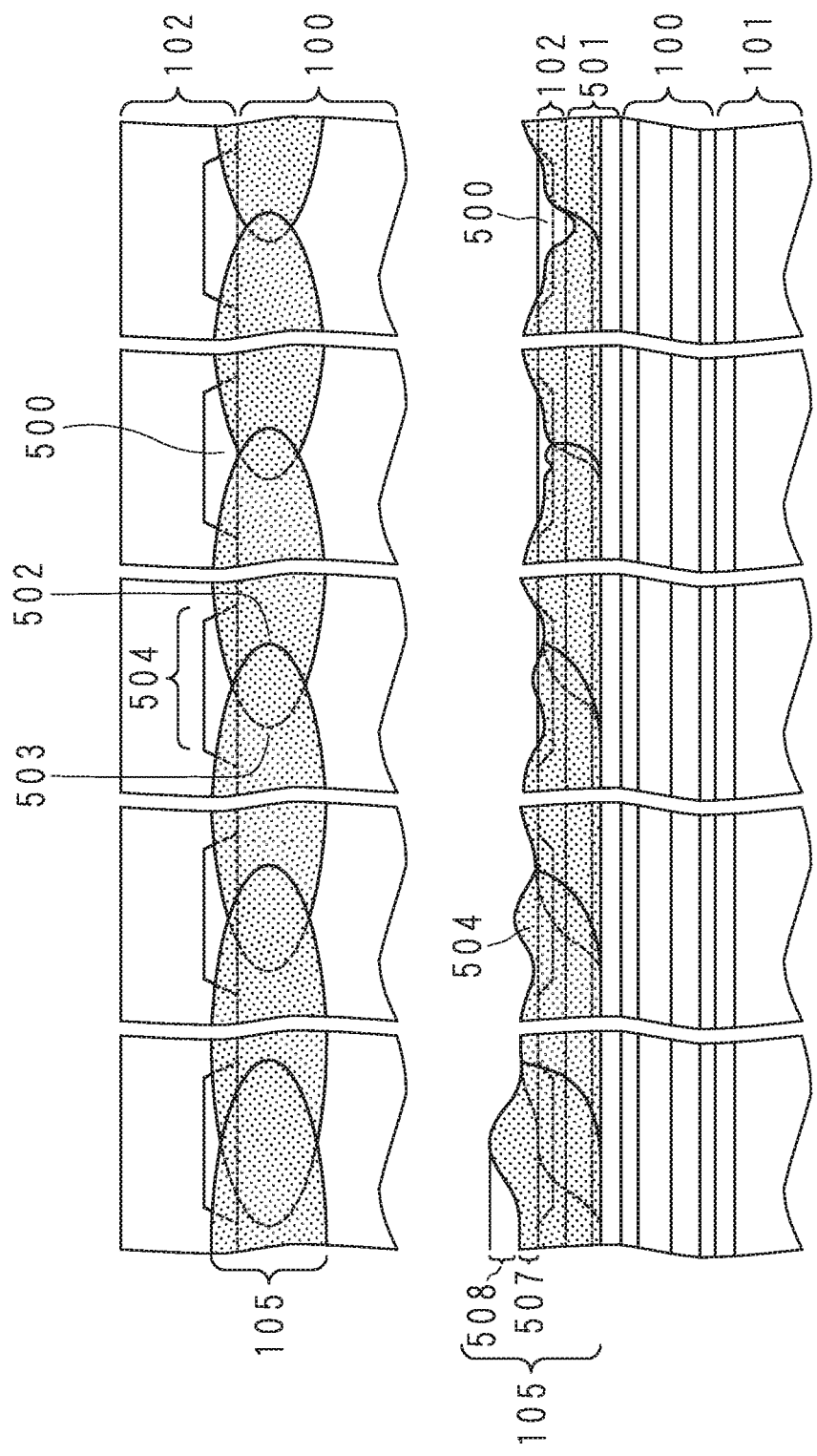

DISPLAY APPARATUS AND METHOD OF MANUFACTURING THE SAME

This non-provisional application claims priorities under 35 U.S.C. § 119(a) on Patent Application No. 2016-111987 filed in Japan on Jun. 3, 2016, the entire contents of which are hereby incorporated by reference.

FIELD

The present invention relates to a display apparatus and a method of manufacturing the display apparatus.

BACKGROUND

In recent years, a display apparatus with a front panel such as a touch panel or a reinforced glass mounted on a surface of a display module including a display panel has been more widespread. The touch panel is used as an input device for the display apparatus. The reinforced glass is used for protecting the display surface. The reinforced glass may be decorative-printed from the perspective of improved design of the display apparatus.

A method of placing the front panel in the display module includes a method of bonding the display panel with the front panel in the display module at a peripheral part with the use of an adhesive or the like. An air space is present between the display panel and the front panel. This bonding method is called air gap bonding for convenience. Here, reflection of light occurs at the interfaces on both sides of the air space, since the refractive index of the front panel and display panel is greatly different from the refractive index of the air space. Thus, the air gap bonding has a problem of significantly reducing the visibility of a displayed image. This phenomenon of the significant deterioration in visibility is particularly notable under the external light environment.

In order to alleviate the deterioration in visibility, a method of bonding the display panel with the front panel by filling the air space with optical clear resin (hereinafter referred to as OCR) having a refractive index close to that of the front panel is employed. It is possible to suppress the reflection at the interface and to improve the visibility of the displayed image. This technique is called optical bonding or direct bonding. The technique has widely been employed also because of a mechanical effect such as enhancement in the impact resistance and anti-scattering at breakage for the front panel.

The upper and lower substrates (hereinafter also collectively referred to as an upper-lower substrate) constituting the display panel is, however, susceptible to external stress in terms of their structures. The local stress applied to the upper-lower substrate induces a display defect such as unevenness or color change. Because a stress is applied to the display module through the front panel in the display apparatus described above, designing a new product and a new manufacturing process are desired.

The structure and manufacturing process of the display apparatus to which the front panel is mounted through the OCR as described earlier are roughly grouped into two.

Japanese Patent Application Laid-Open No. 2010-066711 (hereinafter referred to as Patent Document 1) discloses a housing-out technique in which the front panel is bonded to the surface of the upper-lower substrate constituting the display panel and is thereafter held between a casing and a housing. Japanese Patent Application Laid-Open No. 2009-175701 (hereinafter referred to as Patent Document 2) discloses a housing-in technique in which a front panel is bonded to the surface of a display module including upper and lower substrates. Japanese Patent Application Laid-Open No. 2013-088455 (hereinafter referred to as Patent Document 3) discloses the physical property of a resin material used in the housing-out technique.

The housing-out technique in the former case requires a dedicated design on the assumption that the front panel is to be mounted, which makes it difficult to share components and thus increases the cost of product development. It is however easy to take design measures for a product. Therefore, the housing-out technique may be regarded as a process directed at products of a large lot production, which can sufficiently recover the cost of development. In the case of the housing-out technique, the front face of the front panel and the rear face of the upper-lower substrate are planarly held and uniformly pressurized from both sides. Even in the case where the OCR leaks out over the resin member which seals the OCR, the leaking OCR may be cured later by ultra violet (UV) curing resin used for the OCR. Thus, the manufacturing thereof is relatively easy.

While the housing-in technique described in the latter case is, contrary to the former case, easy to share components or to recover initial expenses, it is difficult to take design measures. Thus, it is often required to solve problems in the manufacturing process. Therefore, the housing-in technique may be regarded as a process directed to a small lot for which the cost of manufacturing is desirably suppressed to the minimum. Since the rear face of the upper-lower substrate is not supported by any part other than the periphery of the casing, it cannot be planarly or uniformly pressurized. If the OCR leaks out over the resin member, the leaking OCR may not be UV-cured. The OCR thus contaminates the inside of the display module. A method of solving such problems has been sought for.

Meanwhile, as for the visibility, the air gap bonding which is inferior to the optical bonding has such an advantage that manufacturing may be carried out at a relatively low cost without the use of OCR. Also in the case of air gap bonding, a problem arises in lowering of the display quality due to intrusion of abnormal substances to the air gap between the display module and the front panel.

It is therefore required to enhance the display quality as in the optical bonding, not only simply bonding the front panel with the display module.

SUMMARY

One aspect of the display apparatus according to an embodiment comprises: a display module including an upper-lower substrate formed by adhering an upper substrate to a lower substrate, a casing that accommodates the upper-lower substrate and a housing with an opening at a display part; a resin member formed on the upper-lower substrate along the entire periphery of a boundary part of the housing adjacent to the opening; and a front panel opposed to the display module across the resin member. The housing is so disposed as to be held between the upper-lower substrate and the front panel, and a worked surface is located at a part of the ridge line of the boundary part of the housing. The resin member is in contact with the entire periphery of the boundary part of the housing, and hangs over the edge of the upper surface of the housing.

It is to be understood that both the foregoing general description and the following detailed description are exemplary and explanatory and are not restrictive of this disclosure.

BRIEF DESCRIPTION OF THE DRAWINGS

FIG. 2A illustrates workpiece preparation in the outlined manufacturing process based on the optical bonding housing-out technique;

FIG. 2B illustrates dam application and curing in the outlined manufacturing process based on the optical bonding housing-out technique;

FIG. 2C illustrates OCR application in the outlined manufacturing process based on the optical bonding housing-out technique;

FIG. 2D illustrates bonding of the front panel in the outlined manufacturing process based on the optical bonding housing-out technique;

FIG. 2E illustrates OCR temporary curing in the outlined manufacturing process based on the optical bonding housing-out technique;

FIG. 2F illustrates OCR complete curing in the outlined manufacturing process based on the optical bonding housing-out technique;

FIG. 3A illustrates workpiece preparation in the outlined manufacturing process based on the optical bonding housing-in technique;

FIG. 3B illustrates dam application and curing in the outlined manufacturing process based on the optical bonding housing-in technique;

FIG. 3C illustrates OCR application in the outlined manufacturing process based on the optical bonding housing-in technique;

FIG. 3D illustrates bonding of the front panel in the outlined manufacturing process based on the optical bonding housing-in technique;

FIG. 3E illustrates OCR temporary curing in the outlined manufacturing process based on the optical bonding housing-in technique;

FIG. 3F illustrates OCR complete curing in the outlined manufacturing process based on the optical bonding housing-in technique;

FIG. 6A is a schematic section view illustrating the cross-section structure (cross section along VI-VI in FIG. 1) of the display apparatus;

FIG. 6B is a schematic section view illustrating the cross-section structure (cross section along VI-VI in FIG. 4) of the display apparatus;

FIG. 8A is a schematic section view illustrating a position where a resin dam is formed in the housing-in technique;

FIG. 8B is a schematic section view illustrating a position where a resin dam is formed in the housing-in technique;

FIG. 12A shows a schematic top view and a schematic side view illustrating the adaptability of the bulge at the dam joint part;

FIG. 12B shows a schematic top view and a schematic side view illustrating the adaptability of the bulge at the dam joint part;

FIG. 12C shows a schematic top view and a schematic side view illustrating the adaptability of the bulge at the dam joint part;

FIG. 12D shows a schematic top view and a schematic side view illustrating the adaptability of the bulge at the dam joint part;

FIG. 12E shows a schematic top view and a schematic side view illustrating the adaptability of the bulge at the dam joint part;

FIG. 13A is a schematic section view illustrating an example of a basic cross-sectional shape of the housing;

FIG. 13B is a schematic section view illustrating an example of a basic cross-sectional shape of the housing;

FIG. 13C is a schematic section view illustrating an example of a basic cross-sectional shape of the housing;

FIG. 16A shows a schematic enlarged perspective view and a schematic section view illustrating a composite example of corner treatment performed on the boundary part of the housing;

FIG. 16B shows a schematic enlarged perspective view and a schematic section view illustrating a composite example of corner treatment performed on the boundary part of the housing;

FIG. 21A shows a schematic top view and a schematic side view illustrating the adaptability of the bulge at the resin dam joint part;

FIG. 21B shows a schematic top view and a schematic side view illustrating the adaptability of the bulge at the resin dam joint part;

FIG. 21C shows a schematic top view and a schematic side view illustrating the adaptability of the bulge at the resin dam joint part;

FIG. 21D shows a schematic top view and a schematic side view illustrating the adaptability of the bulge at the resin dam joint part;

FIG. 21E shows a schematic top view and a schematic side view illustrating the adaptability of the bulge at the resin dam joint part;

DETAILED DESCRIPTION

Figure 1:
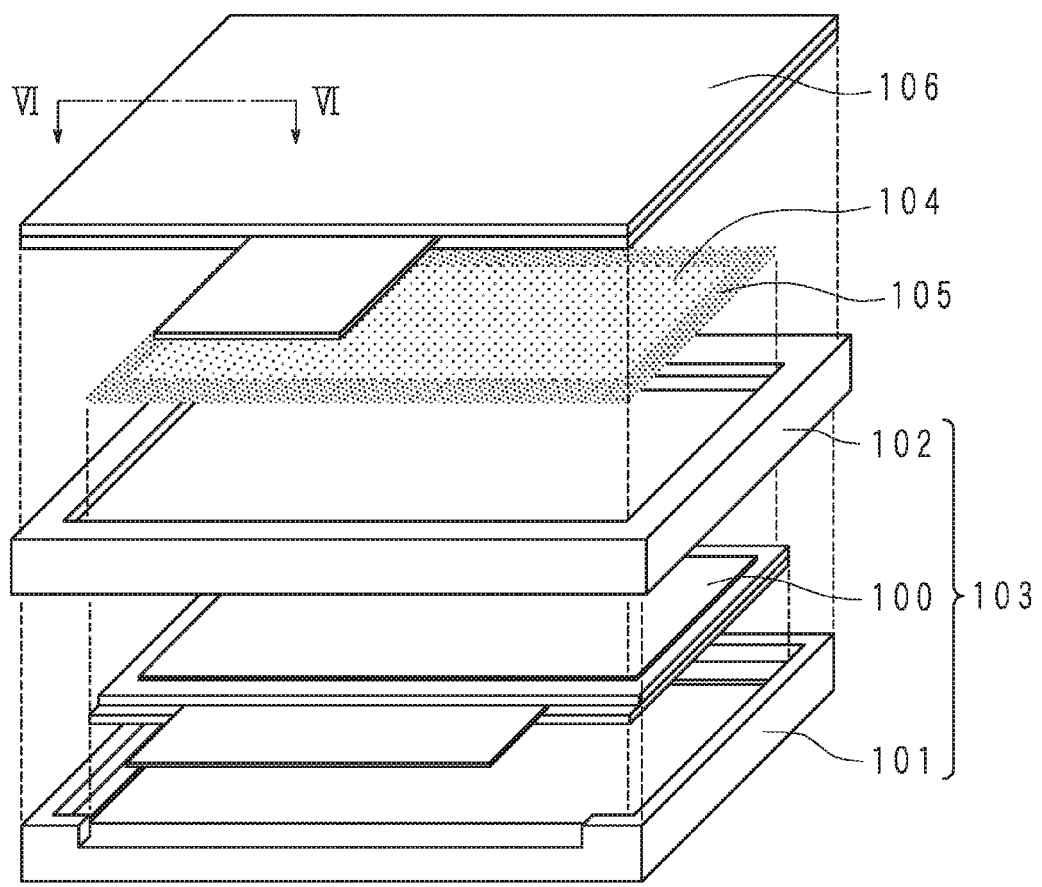
FIG. 1 is a schematic exploded perspective view illustrating a configuration of a display apparatus manufactured based on the housing-in technique.

FIG. 1 is a schematic exploded perspective view illustrating a configuration of a display apparatus manufactured based on the housing-in technique. A unit including an upper-lower substrate 100 formed by adhering an upper substrate to a lower substrate, a casing 101 supporting and accommodating the upper-lower substrate 100, and a housing 102 with a portion for display being opened is referred to as a display module 103. The upper-lower substrate 100 corresponds to a liquid crystal display panel comprising, for example, a color filter (CF) substrate and a thin-film transistor (TFT) substrate. The casing 101 is, for example, a backlight unit. The housing 102 is, for example, a metal bezel.

An example display apparatus includes the display module 103 having a display part entirely bonded with a front panel 106 through OCR 104 which is transparent resin (see FIG. 1). The front panel 106 is, for example, a projected capacitive touch panel (PCAP) or a reinforced glass.

In manufacturing such a display apparatus, a method of forming a seal material made of resin in a gap between the housing 102 and the upper-lower substrate 100 so that the OCR 104 before curing does not leak to the inside of the display module 103 is employed. For convenience, forming of the seal material is called dam forming, the resin to be used is called a dam material, and the formed seal portion is called a resin dam (resin member) 105.

A basic manufacturing process based on the housing-out technique is disclosed in Patent Document 1. A basic manufacturing process based on the housing-in technique is disclosed in Patent Document 2. Which manufacturing process (and the structure of product) is to be selected depends on the product specification, development cost, business policy and so forth. The present application aims to solve a problem in the housing-in technique.

Figure 4:
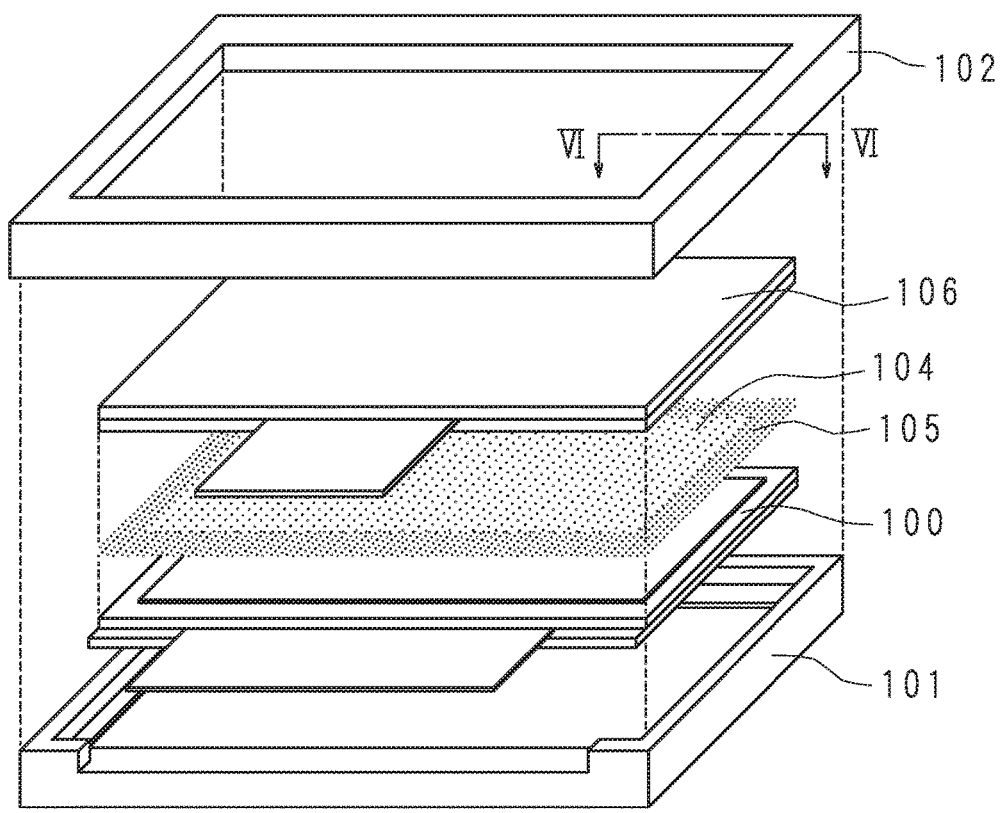
FIG. 4 is a schematic exploded perspective view illustrating a configuration of a display apparatus manufactured based on the housing-out technique.

The outline of the manufacturing process in the housing-out technique according to the comparative example is illustrated in FIGS. 2A to 2F. The outline of the manufacturing process in the housing-in technique is illustrated in FIGS. 3A to 3F. The configuration of the display apparatus manufactured based on the housing-out technique is illustrated in FIG. 4. The configuration of the display apparatus manufactured based on the housing-in technique is illustrated in FIG. 1.

Figure 11:
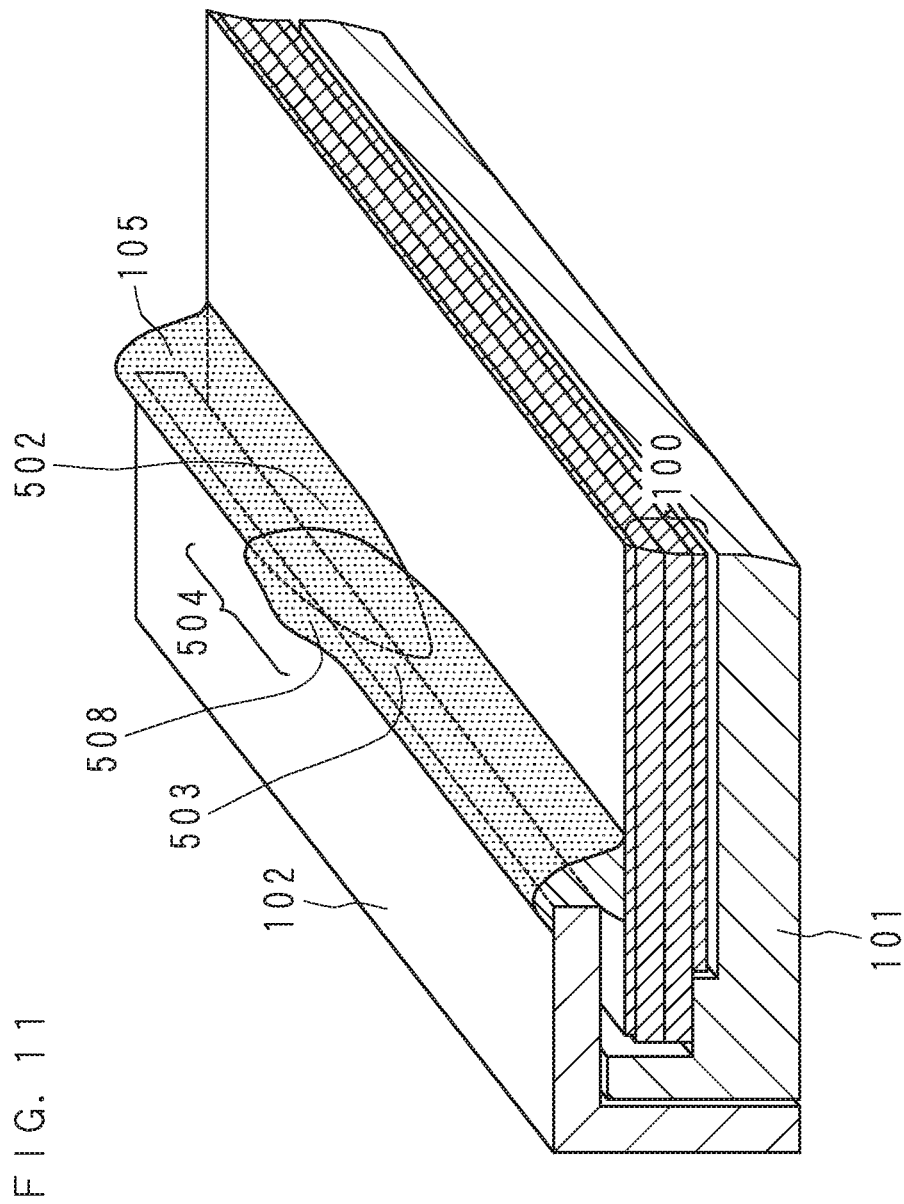
FIG. 11 is a schematic perspective view illustrating a bulge at a dam joint part.

The outline of the manufacturing process based on the housing-out technique is described with reference to FIGS. 2A to 2F. As illustrated in FIG. 2A, the display surface of the upper-lower substrate 100 corresponding to a workpiece is placed in a horizontal state, and the subsequent steps are prepared. As illustrated in FIG. 2B, a dispenser 300 is used to apply the dam material with a single stroke along the perimeter of the upper-lower substrate 100. Here, a resin dam joint part 504 (see FIG. 11) is also formed where a starting end 502 from which the application is started (see FIG. 11) and a finishing end 503 at which the application is finished (see FIG. 11) overlap with each other. Note that the application of the dam material may be repeated more than once. In such a case, more than one resin dam joint parts 504 are also formed. An ultraviolet lamp (UV-lamp) 301 is used for UV irradiation, to cure the dam material and form the resin dam 105.

Figure 9B:
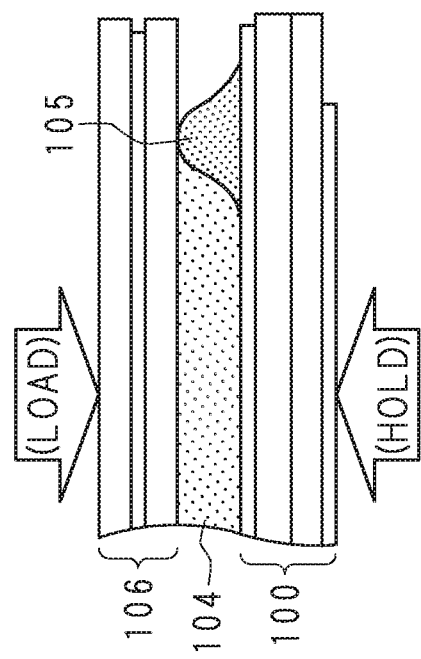
FIG. 9B is a schematic section view illustrating the structure of holding the upper-lower substrate based on the housing-out technique.

As illustrated in FIG. 2C, the OCR 104 is applied to the inside of the resin dam 105. The OCR 104 is desirably applied in a uniform thickness with the use of the dispenser 300 having multiple nozzles. As illustrated in FIG. 2D, the OCR 104 is sandwiched between the upper-lower substrate 100 and the front panel 106 by being covered with the front panel 106. Here, a load is applied to the upper surface of the front panel 106 while holding the lower surface of the upper-lower substrate 100 (see FIG. 9B).

As illustrated in FIG. 2E, the UV-lamp 301 is used for weak UV irradiation to temporarily cure the OCR 104. As illustrated in FIG. 2F, a powerful UV-lamp 302 is used for strong UV irradiation to completely cure the OCR 104. Thereafter, the upper-lower substrate 100 on which the front panel 106 is fixed is incorporated between the casing 101 and the housing 102.

The outline of the manufacturing process based on the housing-in technique is described with reference to FIGS. 3A to 3F. Portions similar to those in the housing-out technique will not be described here. As illustrated in FIG. 3A, the display surface of the display module 103 which is a workpiece is placed in a horizontal state to prepare for the subsequent steps. As illustrated in FIG. 3B, the dispenser 300 is used to apply a dam material with a single stroke along the inner perimeter of the housing 102, i.e. along a boundary part, which is adjacent to the opening, of the housing 102. The UV-lamp 301 is used for UV irradiation, to cure the dam material and form the resin dam 105.

Figure 9A:
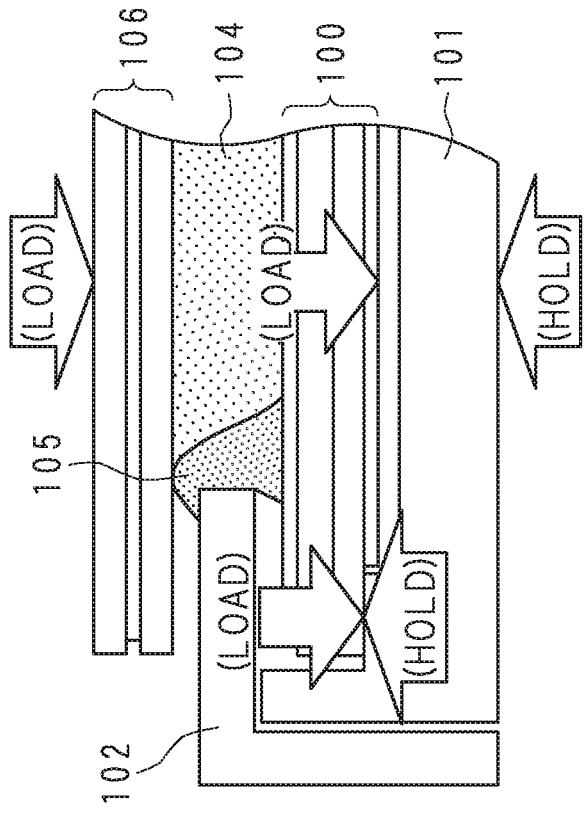
FIG. 9A is a schematic section view illustrating the structure of holding an upper-lower substrate based on the housing-in technique.
Figure 10:
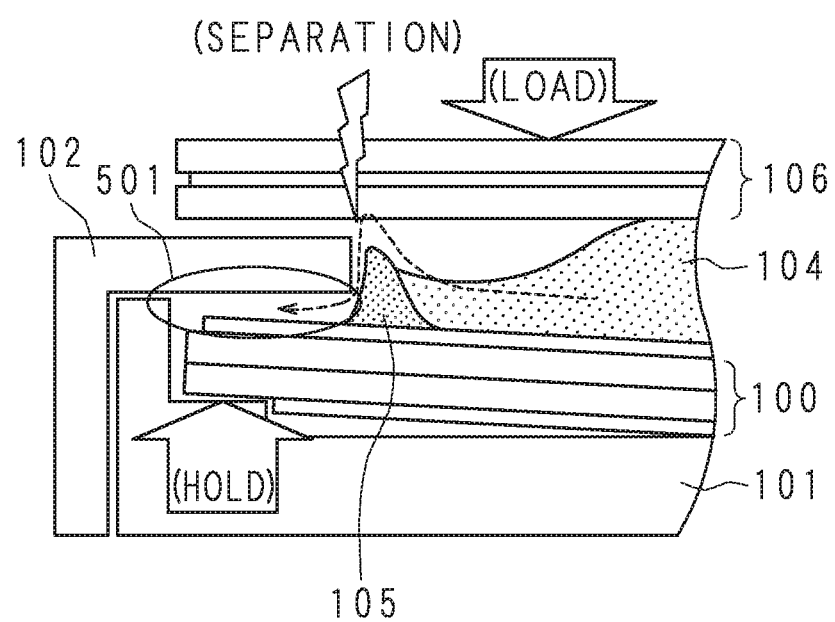
FIG. 10 is a schematic section view illustrating separation of a resin dam due to a load.

As illustrated in FIG. 3C, the OCR 104 is applied to the inside of the resin dam 105. As illustrated in FIG. 3D, the OCR 104 is sandwiched between the display module 103 and the front panel 106 by being covered with the front panel 106. Here, a load is applied to the upper surface of the front panel 106 while holding the lower surface of the casing 101 (see FIG. 9A).

As illustrated in FIG. 3E, the UV-lamp 301 is used for weak UV irradiation to temporarily cure the OCR 104. As illustrated in FIG. 3F, a powerful UV-lamp 302 is used for strong UV irradiation to completely cure the OCR 104. Accordingly, the display module 103 and the front panel 106 are fixed to each other.

Figure 5:
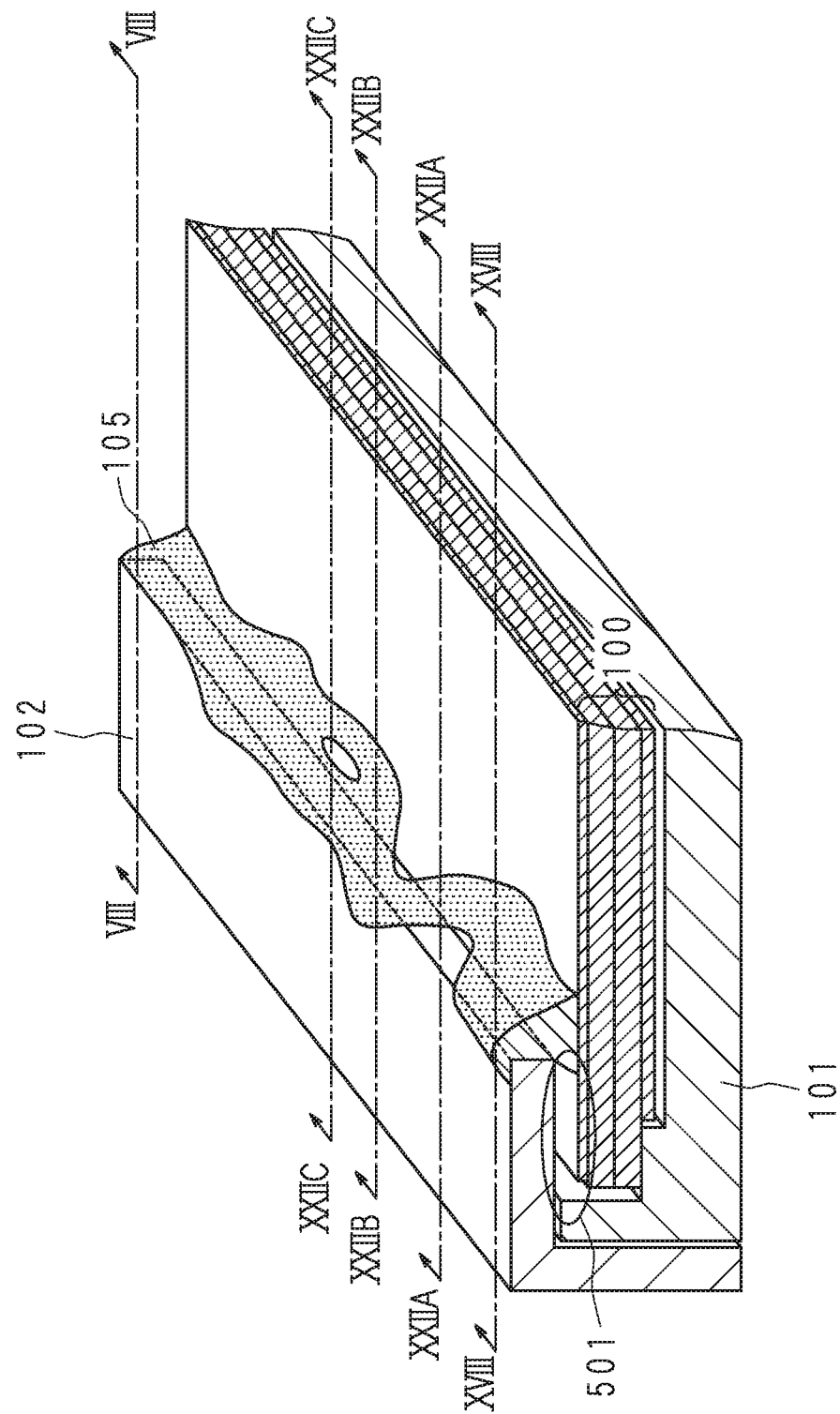
FIG. 5 is a schematic exploded perspective view illustrating an example where the shape of a resin dam changes along the boundary part of the housing.

FIG. 5 is a schematic exploded perspective view illustrating an example where the shape of the resin dam 105 changes along the boundary part of the housing 102. FIG. 5 illustrates the case of the housing-in technique. Variation in the amount of the dam material discharged from the dispenser 300 may vary the thickness, shape, position and the like of the resin dam 105 as illustrated in FIG. 5 along the boundary part of the housing 102. It is noted that the dispenser 300 is set to suppress such variations as much as possible.

The schematic section views cut along the cutting lines shown in FIG. 5 may be used in the description below. The relationship between the figure number of the schematic section view and the cut position in FIG. 5 is shown by a reference code indicated at both ends of the corresponding cutting line.

Comparison between the sectional structures (VI-VI cross-section in FIG. 1, VI-VI cross-section in FIG. 4) of the display apparatuses based on the housing-in technique and the housing-out technique is shown in FIGS. 6A and 6B. The housing-in technique (see FIGS. 3A to 3F) is different from the housing-out technique (see FIGS. 2A to 2F) in the following points. The workpiece to be prepared is the display module 103, not the upper-lower substrate 100. The location where the resin dam 105 is disposed is at the boundary part of the housing 102 adjacent to the opening, i.e. the inner perimeter of the housing, not at the periphery of the upper-lower substrate 100. No incorporating operation is necessary after bonding of the front panel 106.

Since the order of manufacture is different between the housing-out technique and the housing-in technique, differences also lie in the shape and the arrangement of members. As illustrated in FIG. 6B, in the housing-out technique, only the OCR 104 which is an adhesive and the resin dam 105 which suppresses leakage of the OCR 104 are present between the adhered upper-lower substrate 100 and the front panel 106. In the housing-in technique (see FIG. 6A), the housing 102 is also present between the upper-lower substrate 100 and the front panel 106. In the case of the housing-in technique, therefore, restrictions are imposed on the holding manner of the upper-lower substrate 100 at the time of bonding and on the procedure of UV irradiation to the OCR 104 and the dam 105 material.

Figures 7A, 7B:
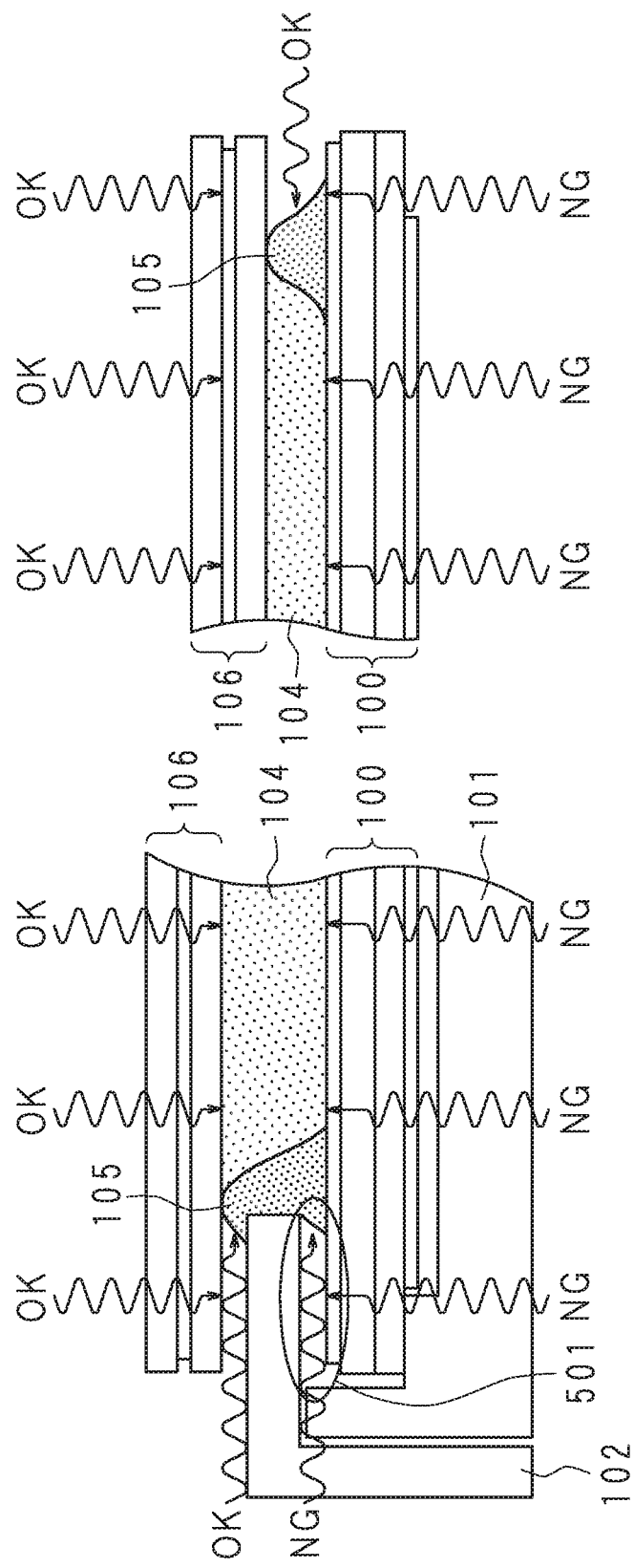
FIG. 7A is a schematic section view illustrating a UV non-irradiable area in the housing-in technique.
FIG. 7B is a schematic section view illustrating UV non-irradiable area in the housing-out technique.

FIGS. 7A, 7B to 11 illustrate the problems. In FIGS. 7A and 7B, "OK" indicates that the OCR 104 or resin dam 105 can be irradiated with UV. In FIGS. 7A and 7B, "NG" indicates that the OCR 104 or resin dam 105 cannot be irradiated with UV because of the interruption of a non-translucent member such as the housing 102. In the case of the housing-out technique (see FIG. 7B), there is no region that cannot be irradiated with UV though a restriction is still present in the direction of UV irradiation. It is thus unnecessary to pay attention to the OCR 104 leaking out over the resin dam 105.

In the case of the housing-in technique (see FIG. 7A), on the other hand, a region that cannot be irradiated with UV (UV non-irradiable area) 501 is present in a space between the upper-lower substrate 100 and the housing 102. In the case of the housing-in technique, the UV non-irradiable area 501 cannot be eliminated. It is thus necessary to take such measures that no resin leaks out or that the UV non-irradiable area 501 is filled in advance in some way. In the housing-in technique, however, interposition of a material between the upper-lower substrate 100 and the housing 102 may induce display abnormality and may also be the cause of increase in the material cost. It is thus necessary to take measures so that resin of the resin dam 105 material, OCR 104 or the like does not leak to the UV non-irradiable area 501.

There are roughly two different positions where the dam is formed based on the housing-in technique. One is the case where the dam is in contact with the housing 102 (see FIG. 8A), and the other is the case where the dam is not in contact with the housing 102 (see FIG. 8B). In the case of non-contact, if the OCR 104 leaks out over the resin dam 105, the OCR 104 intrudes into the UV non-irradiable area 501. The OCR 104 intruded into the UV non-irradiable area 501 cannot be UV-cured. The OCR 104 that cannot be cured may later exude into the display surface and induce display abnormality.

If the resin dam 105 is in contact with the housing 102 (see FIG. 8A), the OCR 104 may be UV-cured even in the case where the OCR 104 leaks out over the resin dam 105. It is therefore desirable that the resin dam 105 in the housing-in technique is in contact with the housing 102. Here, the resin dam 105 has two roles of suppressing the leakage of the OCR 104 and of preventing the leaked-out OCR 104 from intruding into the UV non-irradiable area 501.

The upper-lower substrate 100 in the housing-in technique is held only around the periphery of the casing 101. As such, if a load is applied to the front panel 106, subduction and deformation occur in a middle part of the upper-lower substrate 100 (see FIG. 9A). Such a phenomenon of deformation would not occur in the housing-out technique (see FIG. 9B).

The housing 102 has a thickness of approximately 0.4 to 1.0 millimeters. Thus, the adhesion area between the resin dam 105 and the boundary part of the housing 102 is small. It is therefore possible that the resin dam 105 is separated from the boundary part of the housing 102 without being able to bear the load because of the phenomenon of deformation of the upper-lower substrate 100 described with reference to FIG. 9A. If the separation occurs, the OCR 104 before curing leaks out to the UV non-irradiable area 501 over the resin dam 105 (see FIG. 10).

To address such a phenomenon, a method of selecting a dam material that is hard to be separated from the housing 102 may be contemplated. It is however difficult to employ such a method because of the following reasons. First, considering the use purpose of the display apparatus with the front panel 106, various characteristics such as those listed below are required for the dam material. One is to have transparency so as not to interfere with the visibility required for the display apparatus. Other characteristics are: to be a good match with the OCR 104; to have flexibility (rigidity) of a degree not to cause display abnormality (pressing unevenness or wavelike unevenness) after cured with UV; to have toughness to suppress leakage of the OCR 104; to have an appropriate value of viscosity which affects the dispensing accuracy and workability before curing; and to have adhesiveness which cannot cause separation from the housing 102. The physical properties of the dam material and the OCR 104 are also disclosed in Patent Document 3. In Patent Document 3, however, no consideration is made for the adhesiveness between the dam material and the housing 102. It is therefore necessary to devise appropriate structure and shape.

For a devised form of the dam material, Patent Document 2 discloses a technique of forming the resin dam 105 to hang over the inner edge of the boundary part of the housing 102 (Embodiment 3). However, as the OCR 104, the first adhesive is formed on the upper-lower substrate (display panel) 100 side, and the second adhesive is formed on the front panel (translucent substrate) 106 side for bonding, which makes the manufacturing steps more complicated.

Moreover, in order to prevent uncured dam material from flowing into the UV non-irradiable area 501, it is necessary to quickly cure the dam material. This causes such a problem that a bulge is generated at the resin dam joint part 504, which is the joint part between the starting end 502 and the finishing end 503 of the dam material (see FIG. 11). In the case where the upper and lower substrates 100 that are adhered together as the display panel serves as the workpiece, only a narrow range is allowed for a product to have the bulge 508 at the resin dam joint part 504. In the case where the bulge 508 is locally present, display abnormality (pressing unevenness or wavelike unevenness) may occur around the local point. It may therefore be difficult to control conditions to an appropriate range in the application of the resin dam 105 with the use of the dispenser 300.

The adaptability of the bulge 508 is described with reference to FIGS. 12A to 12E. It is both necessary that the bulge 508 at the resin dam joint part 504 which is the joint part between the starting end 502 and the finishing end 503 of the resin dam 105 is lower than the height 507 of the surrounding resin dam, and that a recess in the resin dam joint part 504 does not lead to the UV non-irradiable area 501.

FIGS. 12A to 12E illustrate five examples where the bulge 508 has different shapes. Each of the upper parts in FIGS. 12A to 12E is a top view of the perspective view illustrated in FIG. 11 seen from the upper side of the drawing. Each of the lower parts in FIGS. 12A to 12E is a side view of the perspective view illustrated in FIG. 11 seen from the right side of the drawing. FIGS. 12A and 12B are not adaptable because the bulge 508 is higher than the surrounding area. FIGS. 12C and 12D are adaptable because the bulge 508 is lower than the surrounding area and the recess does not lead to the UV non-irradiable area 501. FIG. 12E is not adaptable since the recess leads to the UV non-irradiable area 501.

As described earlier, the housing 102 has a thickness of approximately 0.4 to 1.0 millimeters. It is thus difficult to adjust the conditions of forming the dispenser 300 (nozzle width, application position, timing of starting and ending discharge, discharging pressure, discharging speed, suck back pressure and so forth) and to stably fabricate the shape shown in FIG. 12C or 12D.

First, the overall configuration of the display apparatus according to the present embodiment is described. A display module 103 includes an upper-lower substrate 100 formed by adhering an upper substrate to a lower substrate, a casing 101 accommodating the upper-lower substrate 100, and a housing 102 with the display part being opened. The display apparatus includes the display module 103, and a front panel 106 bonded to the surface of the upper-lower substrate 100 via OCR 104 and a resin dam 105 which suppresses leakage of the OCR 104 (see FIG. 1).

The housing 102 of the display module 103 is located at the position between the upper-lower substrate 100 and the front panel 106. The resin dam 105 is in contact with the boundary part of the housing 102. The resin dam 105 is not only in simply contact with the housing 102 but also hangs over the edge of the upper surface (the surface on the front panel 106 side) of the housing 102 so as to prevent separation of the resin dam 105 from the housing 102 (see FIG. 6A). This structure is called as "edge-hanging structure" hereinafter.

Such a structure can prevent the OCR 104 from leaking. Furthermore, even if the OCR 104 leaks out, the leaking OCR 104 may be prevented from intruding into of the display module 103.

In order to accommodate variations in the shape and height of the resin dam 105, the inner edge of the housing 102 over which the resin dam 105 hangs is partially provided with corner treatment. More specifically, partial corner treatment (worked surface 500 such as an inclined surface, an L-shaped surface, a concave curved surface, a convex curved surface or the like) is performed on the position corresponding to the resin dam joint part 504 which is a joint part of the resin dam 105. The corner treatment suppresses the bulge 508 of the resin dam 105 to prevent the occurrence of display abnormality.

The adjustment of the manufacturing facilities and manufacturing conditions may not always be able to solve the bulge 508 at the resin dam joint part 504. Examples of such cases include a case where the selected dam material is hard after curing and thus the bulge 508 at the resin dam joint part 504 directly affects the workpiece, or a case where a workpiece is susceptible to a small bulge 508 remaining at the resin dam joint part 504 and thus display abnormality occurs. In such example cases, the display abnormality may be alleviated by providing a part of the inner edge of the housing 102 located at the resin dam joint part 504 with corner treatment to form the worked surface 500 (see FIG. 14A to FIG. 14D). More specifically, the worked surface 500 is at least one of an inclined surface, an L-shaped surface, a concave curved surface and a convex curved surface. The shape, depth and area obtained by the feasible corner treatment depend on the thickness and material of the housing 102.

The corner treatment may lower the bulge 508 at the resin dam joint part 504 by the height corresponding to the depth of the worked surface 500. This causes no display abnormality, thereby facilitating the forming of the resin dam 105 which is not separated from the housing 102. This can enhance the display quality and manufacturing yield of the display apparatus. Furthermore, the dam material and facilities to be used may have more options.

The housing 102 may be shared with a display module product unnecessary to be bonded with the front panel 106, which can suppress the development cost. Design and development may be carried out in advance supposing that the front panel 106 is to be bonded later based on the housing-in technique, which eliminates an additional expense of development.

While an example of a liquid crystal display apparatus with a touch panel is illustrated in the description below, it is not limited thereto. A similar effect may be expected for any display apparatus having the front panel 106 being bonded to the display surface of the display module 103 in which the upper-lower substrate 100 causing display abnormality by being pressed is incorporated between the housing 102 and the casing 101. The upper-lower substrate 100 is, for example, a plasma panel, an organic EL panel and an electronic paper panel. The front panel 106 is, for example, a touch panel or a protective glass.

From a structural point of view, it is necessary for the housing 102 to be sandwiched between the adhered upper-lower substrate 100 and the front panel 106, and for the dam material to be placed over the end of the upper surface of the housing 102 (end of the surface on the front panel 106 side). Though the material of the housing 102 has no specific restrictions, sheet metal or resin molding is generally used therefor. A metal bezel which was made with sheet metal is taken as an example in the description below.

FIG. 13A to FIG. 13C each illustrates the shape of the basic cross section of the housing 102. The rear surface of the housing 102 which may be in contact with the upper-lower substrate 100 is desirably a flat and smooth surface to a degree not to induce display abnormality (pressing unevenness or wavelike unevenness). The rear surface of the housing 102 may be any state or shape unless it induces display abnormality. The shape for adjusting the thickness of the upper-lower substrate 100 (see FIGS. 13A to 13C) or the presence/absence of an attachment such as a metal piece for electrical connection is not particularly in question.

The following description is made for the shape of a flat and smooth surface without any elaborate geometry or additional attachments (see FIG. 13A). Corner treatment which will be described below is performed on a portion of the ridge line where a front surface reference line 505 and a side surface reference line 506 at the inner edge of the housing 102 on the front panel 106 side cross each other.

Figure 14A:
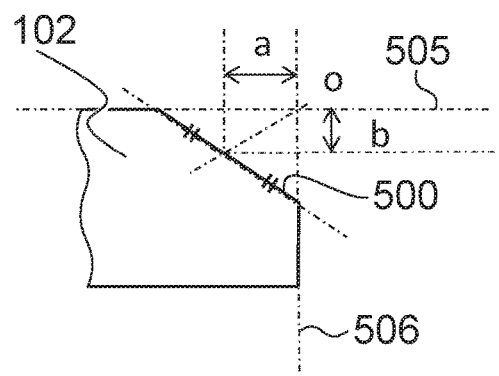
FIG. 14A is a schematic section view illustrating an example of the shape of a worked surface in the corner treatment on a boundary part of the housing.
Figure 14B:
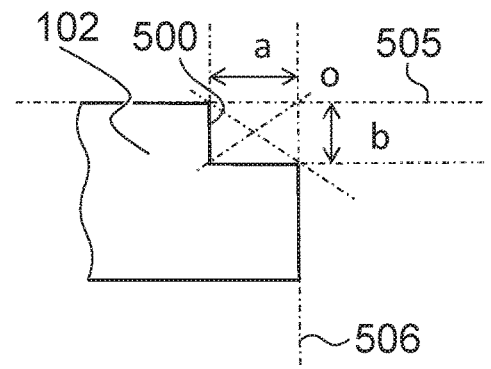
FIG. 14B is a schematic section view illustrating an example of the shape of a worked surface in the corner treatment on a boundary part of the housing.
Figure 14C:
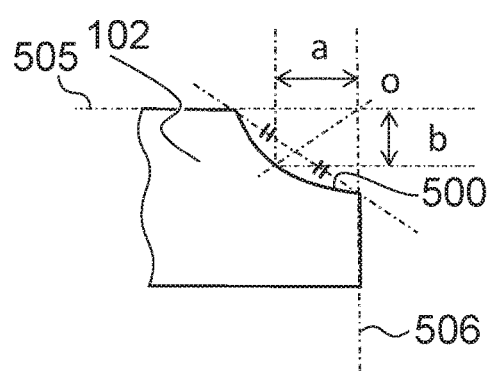
FIG. 14C is a schematic section view illustrating an example of the shape of a worked surface in the corner treatment on a boundary part of the housing.
Figure 14D:
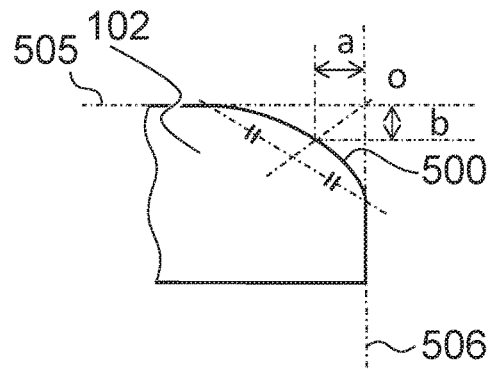
FIG. 14D is a schematic section view illustrating an example of the shape of a worked surface in the corner treatment on a boundary part of the housing.

FIGS. 14A to 14D illustrate schematic cross-section views illustrating the shapes of the worked surface 500 in the corner treatment for the inner edge of the housing 102 which may be laid out by the combination with FIGS. 13A to 13C. FIG. 14A illustrates an inclined surface of the worked surface 500, FIG. 14B illustrates an L-shaped surface of the worked surface 500, FIG. 14C illustrates a concave curved surface of the worked surface 500, and FIG. 14D illustrates a convex curved surface of the worked surface 500. Any shape may be employed for corner treatment if the inner edge of the housing 102 after the corner treatment is recessed to the inner side without protruding from the front surface reference line 505 as well as the side surface reference line 506 and does not reach the crossing point o of the both reference lines (ridge line of the housing 102 without corner treatment). The shape obtained by the corner treatment may be a shape formed by combining any two or more shapes. Specific examples of the combined shape will be described later.

When lined up in the order of effectiveness, FIG. 14B>FIG. 14C>FIG. 14A>FIG. 14D. Desired dimensions may be a≥0.5 millimeters and b≥0.1 millimeters. Depending on the material and the working method of the housing 102, the fabricated shape of the part subject to corner treatment differs. The description below is made for the shapes illustrated in FIGS. 14A and 14B.

Figure 15:
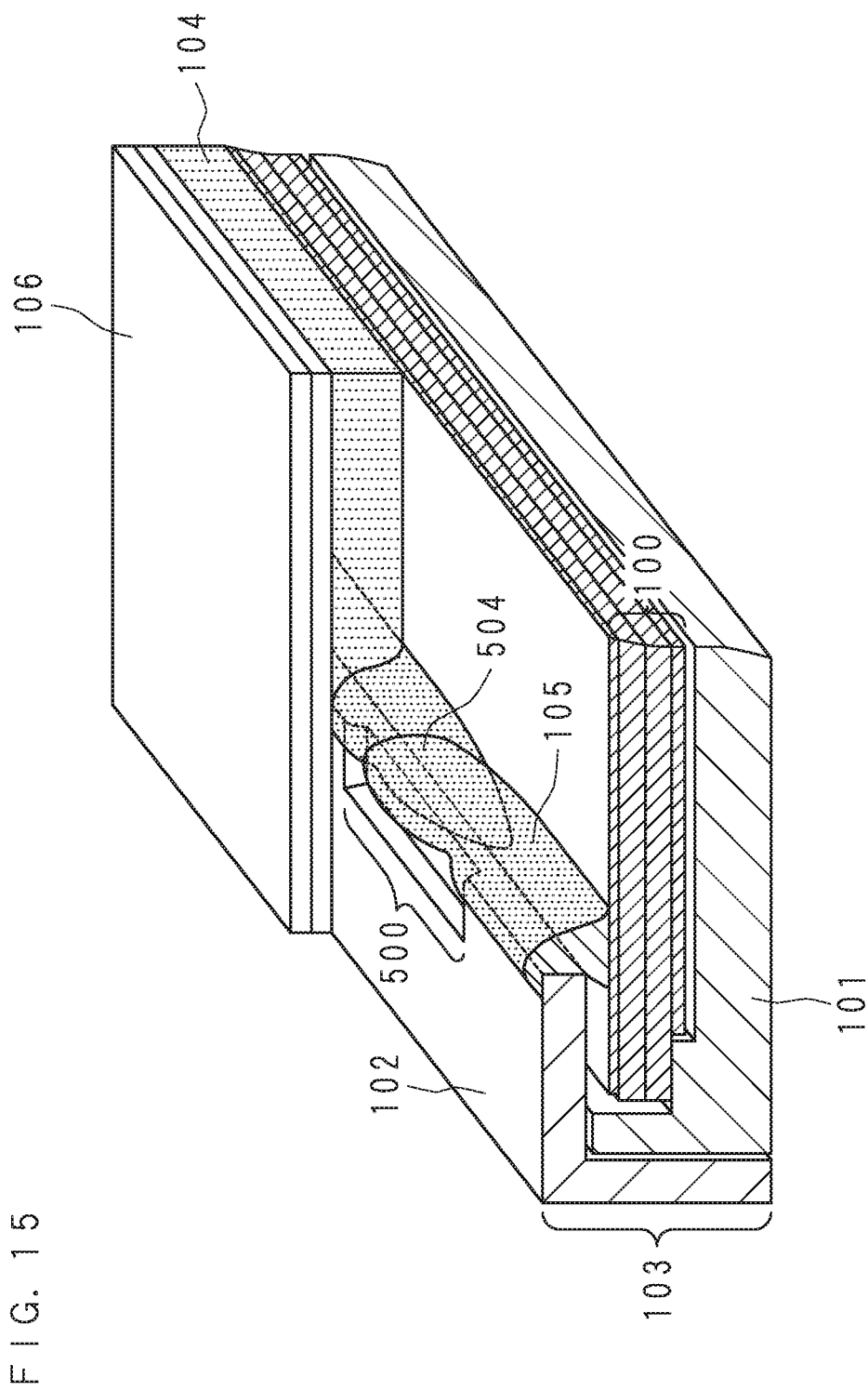
FIG. 15 is a schematic partial section view illustrating the arrangement position and the width (length along the inner edge of the housing) of a worked surface.

FIG. 15 is a partial section view illustrating the arrangement position and the width (length along the inner edge of the housing 102) of the worked surface 500 obtained by the corner treatment for the inner edge of the housing 102. The position to be provided with corner treatment is a position corresponding to the resin dam joint part 504 as illustrated in FIG. 15. The width of the portion to be provided with corner treatment corresponds to the length including at least a portion where the resin of the resin dam joint part 504 bulges.

FIGS. 16A and 16B illustrate the cases where the worked surface 500 is further formed on the entire inner edge of the housing 102 in addition to the above-described position corresponding to the resin dam joint part 504. FIGS. 16A and 16B show variations of the shape of the worked surface 500. The lower parts of FIGS. 16A and 16B show enlarged perspective views of the housing 102 in the vicinity of the portion corresponding to the resin dam joint part 504. The upper parts of FIGS. 16A and 16B show section views of the housing 102 cut at the portion corresponding to the resin dam joint part 504. The details of the shapes illustrated in FIGS. 16A and 16B will be described later.

Figure 17B:
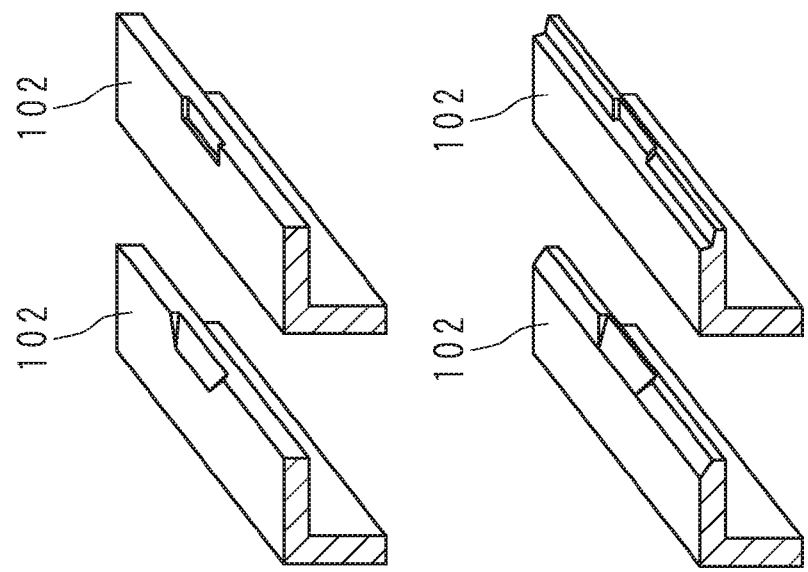
FIG. 17B illustrates an example of the shape of the boundary part of the housing in the corner treatment.
Figure 17A:
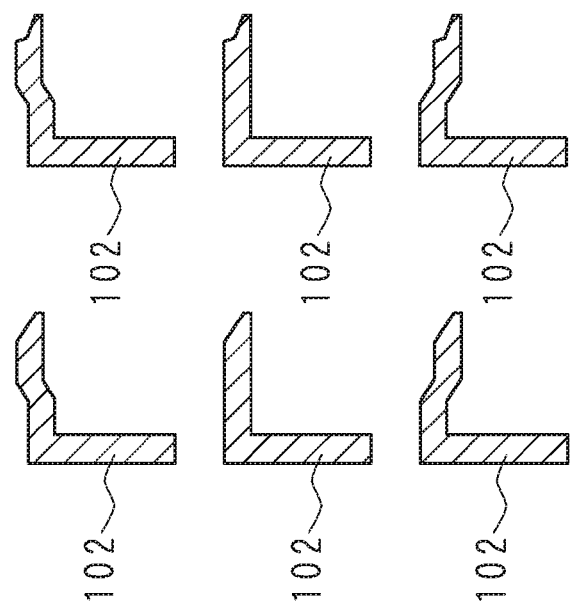
FIG. 17A illustrates an example of the shape of the boundary part of the housing in the corner treatment.

FIGS. 17A and 17B illustrate examples of the shapes of the inner edge of the housing 102 obtained by the corner treatment. Examples of typical shapes are illustrated in FIGS. 17A and 17B.

FIG. 17A illustrates schematic section views of six examples of cross sectional shapes of the housing 102 where the three basic cross sectional shapes of the housing 102 illustrated in FIGS. 13A, 13B and 13C are combined with the two shapes obtained by corner treatment illustrated in FIGS. 14A and 14B. The two shapes at the top of FIG. 17A show examples of the shapes of the housing 102 illustrated in FIG. 13B. The two shapes at the middle of FIG. 17A show examples of the shapes of the housing 102 illustrated in FIG. 13A. The two shapes at the bottom of FIG. 17A show examples of the shapes of the housing 102 illustrated in FIG. 13C. The three shapes at the left side of FIG. 17A show examples of the shapes obtained by corner treatment illustrated in FIG. 14A. The three shapes at the right side of FIG. 17A show examples of the shapes obtained by corner treatment illustrated in FIG. 14B.

FIG. 17B illustrates schematic perspective views illustrating four examples of partially-enlarged perspective views of the housing 102 where the two shapes obtained by corner treatment illustrated in FIGS. 14A and 14B are combined with the arrangement in the corner treatment illustrated in FIGS. 15, 16A and 16B. The upper left part of FIG. 17B shows an example of the shape obtained by corner treatment illustrated in FIG. 14A positioned according to the arrangement illustrated in FIG. 15. The upper right part of FIG. 17B shows an example of the shape obtained by corner treatment illustrated in FIG. 14B positioned according to the arrangement illustrated in FIG. 15. The lower left part of FIG. 17B shows an example of the shape obtained by corner treatment illustrated in FIG. 14A positioned according to the arrangement illustrated in FIG. 16A. The lower right part of FIG. 17B shows an example of the shape obtained by corner treatment illustrated in FIG. 14B positioned according to the arrangement illustrated in FIG. 16B.

There are no physical restrictions for the dam material or OCR 104 of an energy-ray curing type such as a UV curing type used for different shapes. Furthermore, even if resin of a moisture curing type, a thermal curing type, a two-liquid curing type or a combined curing type in which two or more of these curing types are combined together, which requires more time for curing compared to the energy ray curing type, is employed, an effect similar to that with the UV curing resin may be obtained. Even with the use of any resin material, the resin dam 105 is formed in the state of hanging over the inner edge of the housing 102, so that an effect of increasing the withstand load may be obtained.

[Embodiment 1]

Next, specific embodiments will be described.

FIG. 1 illustrates a configuration of a display apparatus according to Embodiment 1. A general display module 103 is so configured that the upper-lower substrate (liquid crystal display panel) 100 is incorporated between the casing (backlight) 101 and the housing (metal bezel) 102. The display surface of the display module 103 is used as a workpiece, and the resin dam 105 made of UV-curing resin material seals the entire periphery of the boundary part of the housing 102 without a gap. The OCR 104 is applied to the display surface surrounded by the resin dam 105 with a uniform thickness. The display surface of the display module 103 and the front panel (touch panel) 106 are adhered with each other through the OCR 104. The thickness of the housing 102 is approximately 0.4 millimeters in the case of the display apparatus of 10.4 inches or smaller, and approximately 1 millimeter in the case of the display apparatus of 19 inches or larger.

Figure 18:
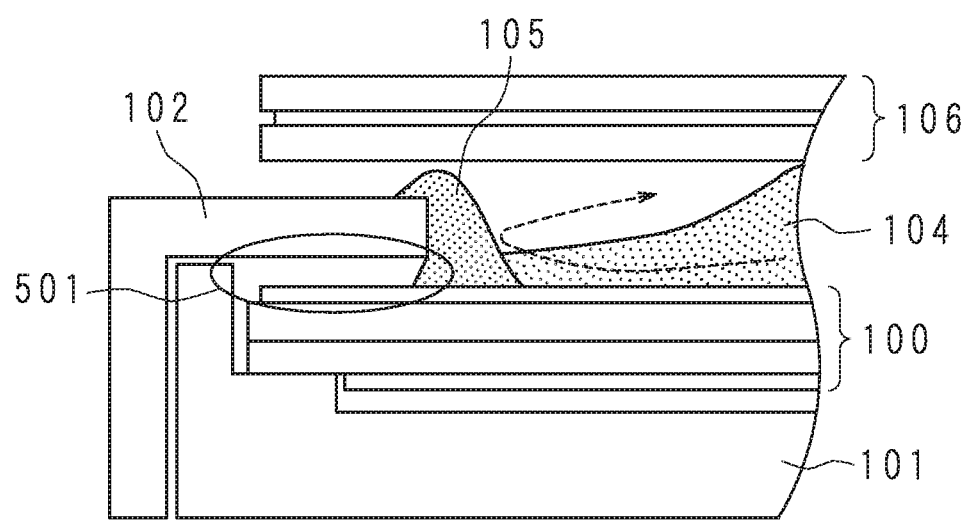
FIG. 18 illustrates a schematic section view of the display apparatus.

FIG. 18 illustrates a schematic section view of the display apparatus. Viewing the cross section of the display apparatus, a gap of approximately 0.2 millimeters is present between the housing 102 and the liquid crystal display panel 100. The resin dam 105 material with the width of approximately 0.5 millimeters and the height of approximately 0.3 millimeters is placed over the upper surface of the boundary part of the housing 102 (the surface thereof on the front panel 106 side) and the display surface of the liquid crystal display panel 100, so that the resin dam 105 is not separated from the housing 102.

Figure 19:
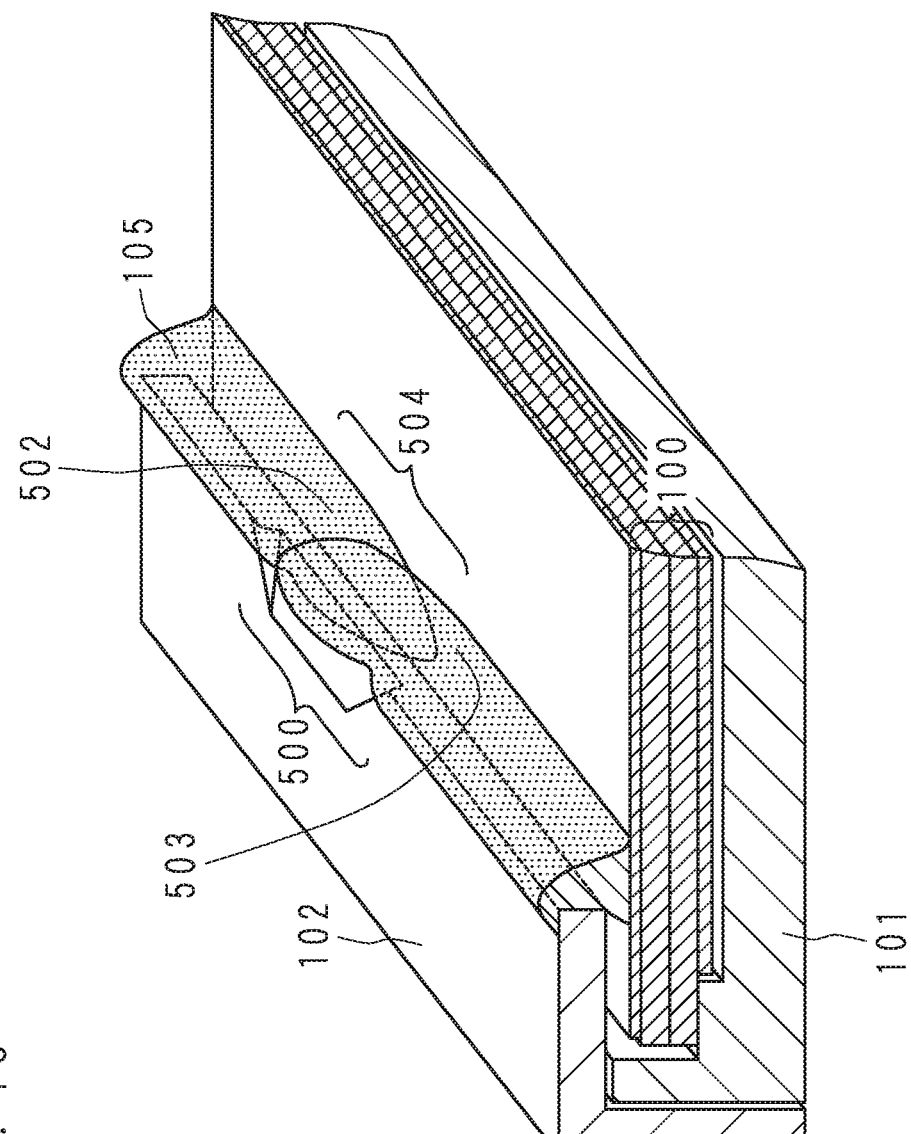
FIG. 19 is a schematic enlarged partial perspective view illustrating an example where a portion corresponding to the resin dam joint part of the housing is provided with corner treatment to have an inclined surface.
Figure 20:
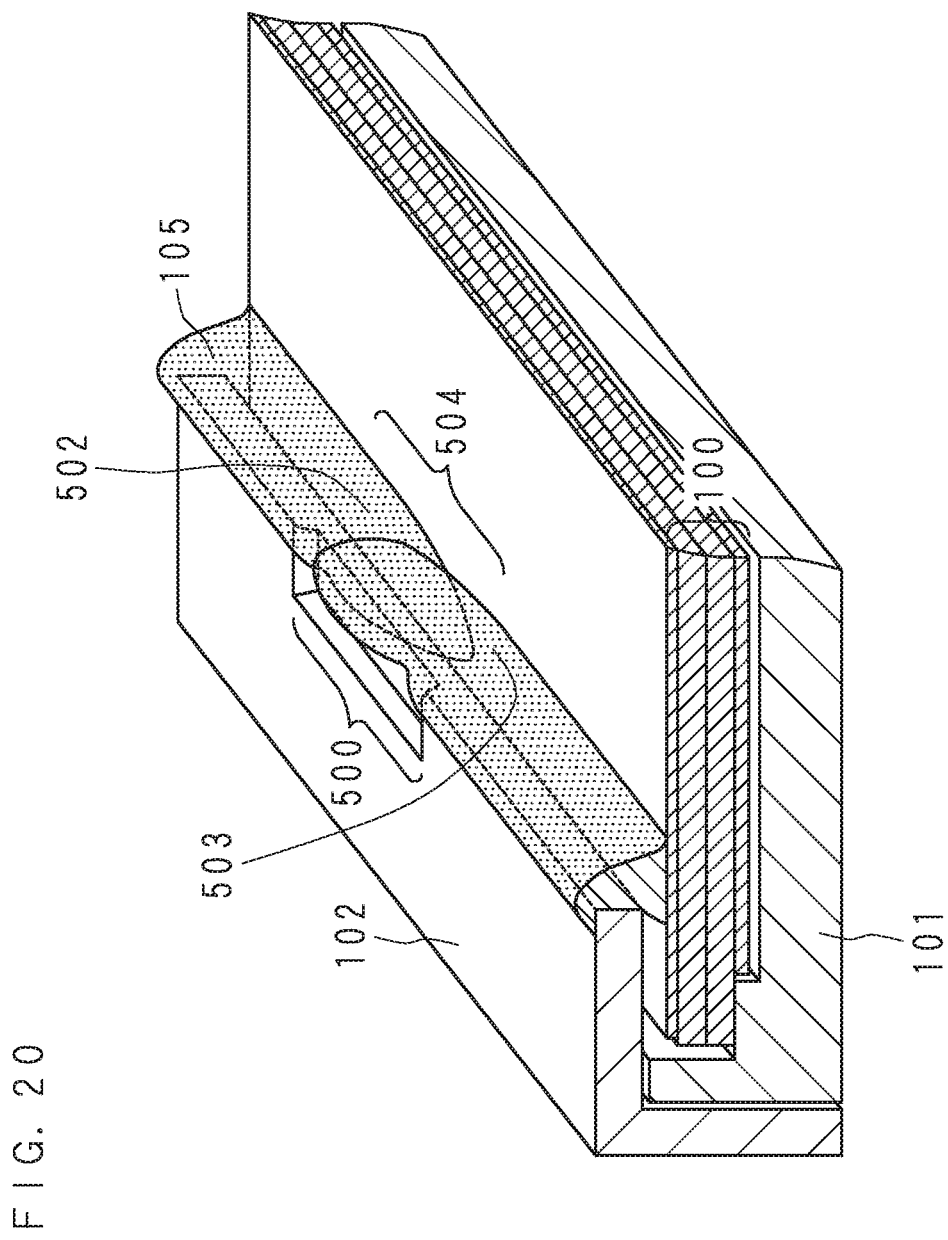
FIG. 20 is a schematic enlarged partial perspective view illustrating an example where a portion corresponding to the resin dam joint part of the housing is provided with corner treatment to have an L-shaped surface.

FIG. 19 is a schematic enlarged partial perspective view illustrating an example where a portion corresponding to the resin dam joint part 504 of the housing 102 is provided with corner treatment to have an inclined surface. FIG. 20 is a schematic enlarged partial perspective view illustrating an example where a portion corresponding to the resin dam joint part 504 of the housing 102 is provided with corner treatment to have an L-shaped surface. As illustrated in FIGS. 19 and 20, a portion of the housing 102 that corresponds to the resin dam joint part 504 is provided with corner treatment, thereby suppressing the bulge. This can suppress the occurrence of display abnormality caused by the bulge 508.

FIGS. 21A to 21E illustrate the adaptability of the bulge 508 of the resin dam joint part 504 for the shapes illustrated in FIGS. 19 and 20. FIGS. 21A to 21E illustrate five examples where the bulge 508 has different shapes. Each of the upper parts in FIGS. 21A to 21E is a top view of the perspective views illustrated in FIGS. 19 and 20 seen from the upper side of the drawing. Each of the lower parts in FIGS. 21A to 21E is a side view of the perspective views illustrated in FIGS. 19 and 20 seen from the right side of the drawing.

FIG. 21A is not adaptable because the bulge 508 is higher than the surrounding area. FIGS. 21B, 21C and 21D are adaptable because the bulge 508 is lower than the surrounding area and the recess does not lead to the UV non-irradiable area 501. FIG. 21E is not adaptable because the recess leads to the UV non-irradiable area 501.

As illustrated in FIGS. 19 and 20, a portion of the housing 102 that corresponds to the resin dam joint part 504 of the housing 102 is partly provided with corner treatment, thereby lowering the height of the bulge 508 at the resin dam 105. For example, the height of the bulge 508 at the resin dam 105 which is approximately the same as that in the unadaptable example of FIG. 12B may be reduced to the height substantially corresponding to the one illustrated in FIG. 21B, making it possible to obtain an adaptable state. This results in suppression of the occurrence of display abnormality in the display panel 100.

According to the present embodiment, the bulge 508 of the resin dam joint part 504 may be made smaller. It is thus possible to prevent the occurrence of display abnormality of the upper-lower substrate 100 caused by the bulge 508 of the resin dam joint part 504.

The housing 102 according to the present embodiment may be shared with a display module product unnecessary to be bonded with the front panel 106, which can reduce the cost and time for development.

An experiment by the present inventors confirmed that the shape of the resin dam 105 which hangs over the edge of the upper surface of the housing 102 (see FIG. 18) has a strength twice as high as that of the shape of the resin dam 105 which is merely in contact with the boundary part of the housing 102. In the case where the display module 103 is bonded with the front panel 106 based on the housing-in technique using the resin dam 105 material and the OCR 104, therefore, the resin dam may desirably have the edge-hanging structure as illustrated in FIG. 18. Furthermore, in order to prevent display abnormality from occurring, the resin dam 105 may desirably be formed with few irregularities at the boundary part of the housing 102.

Figure 22A:
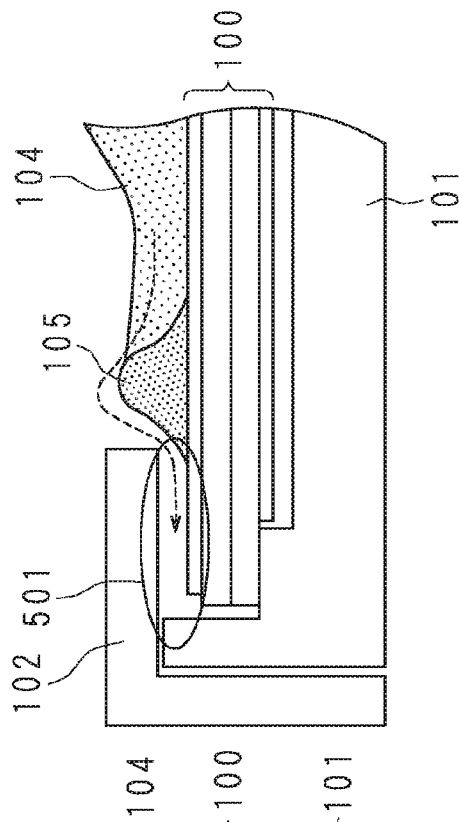
FIG. 22A is a schematic section view illustrating an example of an unadapted shape of the resin dam where a pass to the UV non-irradiable area is present.
Figure 22B:
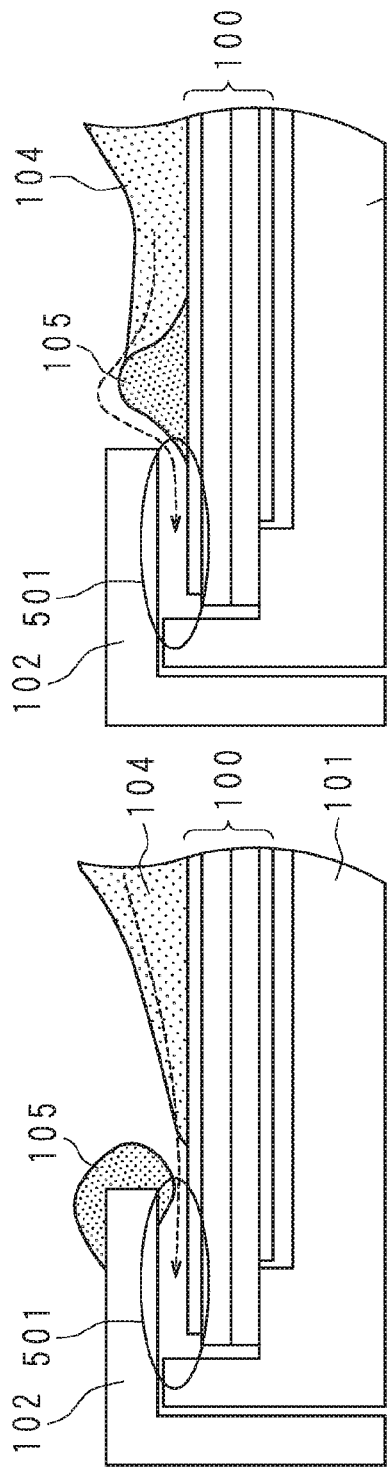
FIG. 22B is a schematic section view illustrating an example of an unadapted shape of the resin dam where a pass to the UV non-irradiable area is present.
Figure 22C:
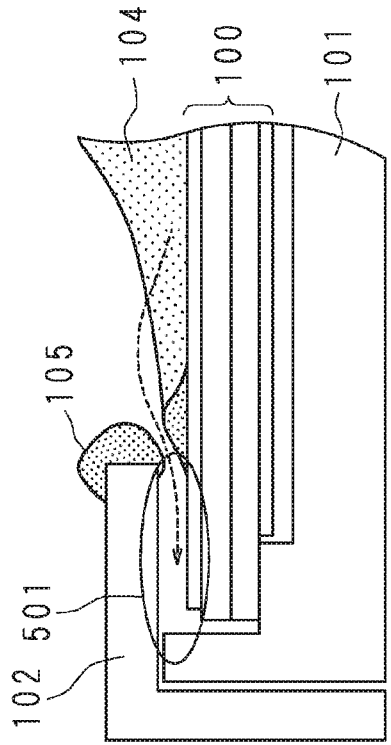
FIG. 22C is a schematic section view illustrating an example of an unadapted shape of the resin dam where a pass to the UV non-irradiable area is present.

As described earlier, in the case of the housing-in technique, the UV non-irradiable area 501 is present. Thus, a pass leading to the UV non-irradiable area 501 cannot be present in the resin dam 105. FIGS. 22A to 22C are schematic section views each illustrating an example of an unadaptable shape of the resin dam 105 where a pass to the UV non-irradiable area 501 is present. In the example illustrated in FIG. 22A, the pass is present between the resin dam 105 and the upper-lower substrate 100. In the example illustrated in FIG. 22B, the pass is present between the resin dam 105 and the housing 102. In the example illustrated in FIG. 22C, the pass is present between parts of the resin dam 105.

[Embodiment 2]

As illustrated in FIG. 8A, it is possible to manufacture the resin dam 105 with the use of a required minimum amount of OCR 104 in the case where the resin dam 105 is only in contact with the boundary part of the housing 102. As illustrated in FIG. 18, however, in the case where the resin dam 105 hangs over the edge of the upper surface of the housing 102, the resin dam 105 has a height increased by approximately 0.3 millimeters (20-30%). This increases the manufacturing cost because of the increased amount of OCR 104 required for manufacturing. The present embodiment relates to the shape of the boundary part of the housing 102 that is capable of alleviating or solving such problems. Portions common to those in Embodiment 1 will not be described here.

FIGS. 16A and 16B illustrate shapes of the housing 102 according to the present embodiment. The present embodiment is suitable for the case where the housing 102 is thick (approximately 0.6 millimeters or more). A position of the housing 102 corresponding to the resin dam joint part 504 is partially provided with corner treatment, and the entire periphery of the boundary part of the housing 102 is further provided with combined corner treatment.

FIG. 16A illustrates an example of the housing 102 where the entire periphery is provided with corner treatment to have an inclined surface (see FIG. 14A) and a position thereof corresponding to the resin dam joint part 504 is further provided with partial corner treatment to have an inclined surface (see FIG. 14A). FIG. 16B illustrates an example where the entire periphery is provided with corner treatment to have an L-shaped surface (see FIG. 14B) and a position thereof corresponding to the resin dam joint part 504 is further provided with partial corner treatment to have an L-shaped surface (see FIG. 14B).

It is not necessary to match the shape obtained by the corner treatment for the entire periphery with the shape obtained by the partial corner treatment corresponding to the resin dam joint part 504. Depending on the material, shape, thickness or the like of the housing 102, the shapes or the like illustrated in FIGS. 14A to 14D may be combined in various ways and appropriately selected.

According to the present embodiment, the bulge 508 of the resin dam joint part 504 may be reduced so as to improve the display quality. Moreover, the reduced height of the resin dam 105 may also lower the manufacturing cost by reducing the amount of the dam material and OCR 104 to be used.

The reasons for reducing the amounts of the dam material and OCR 104 are as follows. Providing with corner treatment over the entire inner edge of the housing 102 is equivalent to reduction in the thickness of the housing 102.

Since the effective thickness of the housing 102 is smaller, the height of the resin dam 105 may be lower, therefore the amounts of the dam material and OCR 104 are reduced. When the height of the resin dam 105 is lower, OCR 104 is easier to leak out between housing 102 and the front panel 106. This area can however be UV-cured later, and therefore the leakage causes no fatal problem.

[Embodiment 3]

Embodiment 1 and Embodiment 2 described the case of optical bonding where the display module 103 is bonded with the front panel 106 through the OCR 104. The present embodiment relates to a display apparatus of an air gap bonding structure where the display module 103 is bonded with the front panel 106 via an air space 107. Portions common to those in Embodiment 1 will not be described here.

Figure 23:
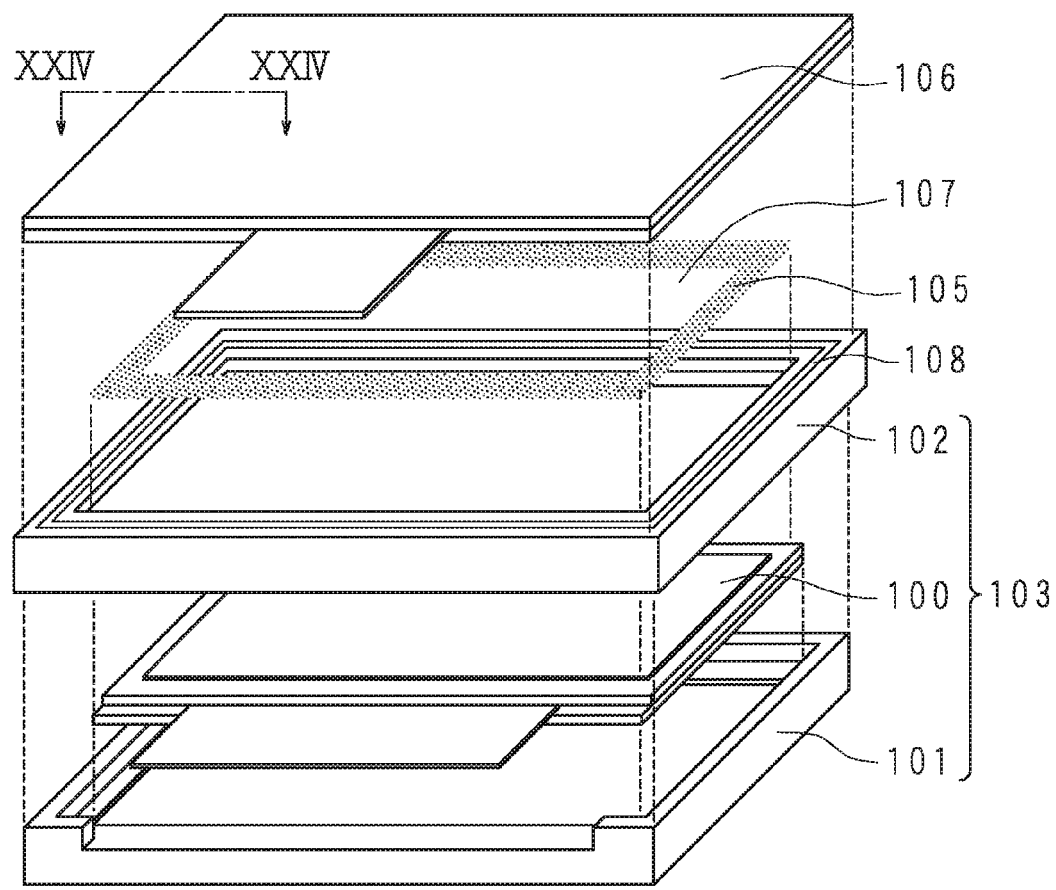
FIG. 23 is a schematic exploded perspective view illustrating the configuration of a display apparatus according to Embodiment 3.
Figure 24:
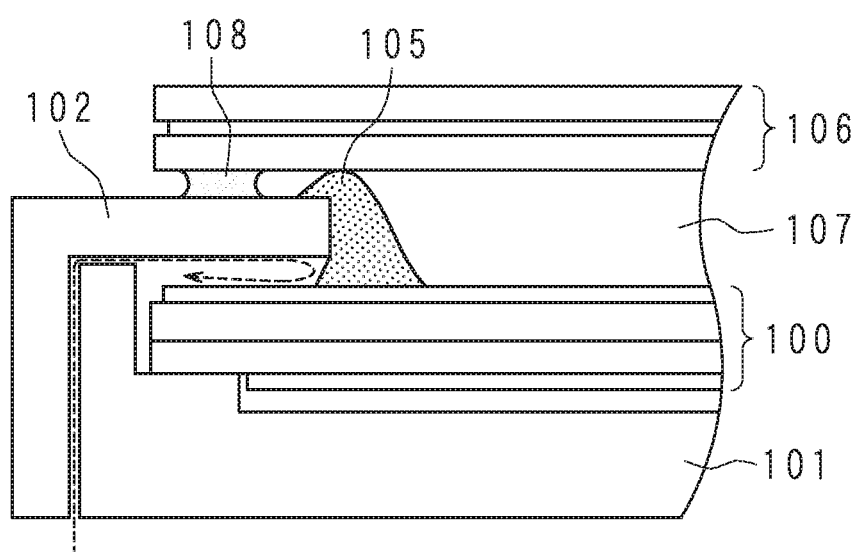
FIG. 24 is a schematic section view illustrating a configuration of a display apparatus according to Embodiment 3.

FIG. 23 is a schematic exploded perspective view illustrating the configuration of a display apparatus according to Embodiment 3. FIG. 24 is a schematic section view illustrating a display apparatus according to Embodiment 3. The air space 107 is present between the display module 103 and the front panel 106. The housing 102 and the front panel 106 are bonded with each other by a double-sided adhesive tape 108. The resin dam 105 is formed to prevent abnormal substances from intruding into the air space 107.

According to the present embodiment, the bulge 508 of the resin dam joint part 504 may be made smaller to prevent display abnormality as in Embodiments 1 and 2. Furthermore, the resin dam 105 is configured to hang over the edge of the boundary part of the housing 102 so as not to easily be separated from the housing 102. This can prevent the display quality from lowering due to intrusion of abnormal substances into the display part.

In addition, technical characteristics (configuration requirements) described in each embodiment may be combined with each other, and new technical characteristics may be formed by combining the same.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A display apparatus, comprising:
a display module including an upper-lower substrate formed by adhering an upper substrate to a lower substrate, a casing accommodating the upper-lower substrate, and a housing with an opening at a display part, and having a space between the housing and the upper-lower substrate;
a resin member formed with a width on the upper-lower substrate along an entire periphery of the opening of the housing and having a partial bulge in a height direction; and
a front panel opposed to the display module across the resin member,
wherein
the housing is placed between the upper-lower substrate and the front panel,
a worked surface is located at a part corresponding to the partial bulge in the height direction of a ridge line of a boundary part of the housing, the boundary part being adjacent to the opening, and
the resin member is so formed as to be in contact with the entire periphery of the boundary part of the housing and to hang over an inner edge of an upper surface of the housing.

2. The display apparatus according to claim 1, further comprising transparent resin on the upper-lower substrate inside the resin member,
wherein the display module is bonded with the front panel through the resin member and the transparent resin.

3. The display apparatus according to claim 1, wherein the worked surface is an inclined surface, an L-shaped surface, a concave curved surface or a convex curved surface.

4. The display apparatus according to claim 1, wherein the worked surface is formed to correspond to a joint part of the resin member at the boundary part of the housing.

5. The display apparatus according to claim 1, wherein the worked surface is further located in a compounded manner along the entire periphery of the boundary part of the housing.

6. The display apparatus according to claim 1, wherein a sectional shape of the worked surface corresponds to a shape recessed inward from a front surface and a side surface of the boundary part of the housing on the front panel side where the worked surface is not located.

7. The display apparatus according to claim 1, wherein the resin member is made of a material of an energy ray curing type, a moisture curing type, a thermal curing type or a two-liquid curing type, or a material of a composition of any two or more of the types.

8. The display apparatus according to claim 2, wherein the transparent resin is made of a material of an energy ray curing type, a moisture curing type, a thermal curing type or a two-liquid curing type, or a material of a composition of any two or more of the types.

9. A method of manufacturing the display apparatus according to claim 1, comprising:
placing the display module, including the upper-lower substrate formed by adhering the upper substrate to the lower substrate, the casing accommodating the upper-lower substrate and the housing with an opening at the display part, such that the housing is located at an upper side and the space is between the housing and the upper-lower substrate;
applying resin having fluidity to form the resin member having the width and the partial bulge in the height direction, the resin being applied to the entire periphery of the boundary part of the housing starting from and finishing at the worked surface formed on the part corresponding to the partial bulge in the bulge of the ridge line of the boundary part so as to hang over an inner edge of an upper surface of the housing, the boundary part being adjacent to the opening; and
placing the front panel to be opposed to the display module across the resin.

* * * * *